United States Patent [19]
Kohno

[11] Patent Number: 6,141,291
[45] Date of Patent: Oct. 31, 2000

[54] SEMICONDUCTOR MEMORY DEVICE

[75] Inventor: Fumihiro Kohno, Kawasaki, Japan

[73] Assignee: Kabushiki Kaisha Toshiba, Kawasaki, Japan

[21] Appl. No.: 09/425,291

[22] Filed: Oct. 25, 1999

Related U.S. Application Data

[63] Continuation of application No. 09/168,673, Oct. 9, 1998, which is a continuation of application No. 08/907,030, Aug. 6, 1997, Pat. No. 5,838,629, which is a division of application No. 08/696,738, Aug. 14, 1996, Pat. No. 5,793,695, which is a division of application No. 08/379,290, Jan. 27, 1995, Pat. No. 5,825,714.

[30] Foreign Application Priority Data

| Jan. 31, 1994 | [JP] | Japan | 6-008921 |
| Jan. 23, 1995 | [JP] | Japan | 7-008471 |

[51] Int. Cl.[7] .................. G11C 7/00; G11C 8/00
[52] U.S. Cl. ............... 365/230.06; 365/189.09; 365/189.11
[58] Field of Search .......... 365/189.09, 189.11, 365/230.06, 203, 230.08

[56] References Cited

U.S. PATENT DOCUMENTS

| 4,344,005 | 8/1982 | Stewart | 307/463 |
|---|---|---|---|
| 5,018,107 | 5/1991 | Yoshida | 365/230.06 |
| 5,103,113 | 4/1992 | Inui | 326/106 |
| 5,202,855 | 4/1993 | Morton | 365/226 |
| 5,227,996 | 7/1993 | Uchida | 365/230.06 |
| 5,282,167 | 1/1994 | Tanaka et al. | 365/206 |
| 5,287,312 | 2/1994 | Okamura et al. | 365/201 |
| 5,351,217 | 9/1994 | Jeon | 365/230.06 |
| 5,373,479 | 12/1994 | Noda | 365/230.06 |
| 5,412,331 | 5/1995 | Jun | 326/105 |
| 5,490,119 | 2/1996 | Sakurai et al. | 365/230.08 |
| 5,610,872 | 3/1997 | Toda | 365/230.06 |
| 5,615,164 | 3/1997 | Kirihata | 365/230.06 |
| 5,673,229 | 9/1997 | Okamura et al. | 365/201 |
| 5,717,650 | 2/1998 | Chung | 365/230.06 |
| 5,793,695 | 8/1998 | Kohno | 365/230.06 |
| 5,822,253 | 10/1998 | Lines | 365/189.11 |
| 5,862,098 | 1/1999 | Jeong | 365/230.06 |
| 6,041,014 | 3/2000 | Atsumi et al. | 365/230.06 |

FOREIGN PATENT DOCUMENTS

| 0 068 892 | 1/1983 | European Pat. Off. . |
| 0 107 864 | 5/1984 | European Pat. Off. . |
| 0 210 454 | 2/1987 | European Pat. Off. . |
| 41 17 967 | 12/1991 | Germany . |
| 3-86995 | 3/1991 | Japan . |
| 4-106794 | 4/1992 | Japan . |

OTHER PUBLICATIONS

"High–Speed, High–Reliability Circuit Design for Megabit DRAM", Gillingham, et al.; *IEEE J. of Solid–State Circuit*, vol. 26, No. 8, Aug. 1991, pp. 1171–1175.

Komatsuzaki et al., Circuit Techniques for a Wide World I/O Path 64 Meg DRAM; 1991 VISI Synp., Circuits 14–5, pp. 133–134.

*Primary Examiner*—Son Mai
*Attorney, Agent, or Firm*—Banner & Witcoff, Ltd.

[57] ABSTRACT

A semiconductor memory device comprising a plurality of row decoders, each having a precharge circuit connected to receive a precharge signal and a decode circuit connected to receive address signals. A level-shifted precharge signal is input to the precharge circuits.

20 Claims, 18 Drawing Sheets

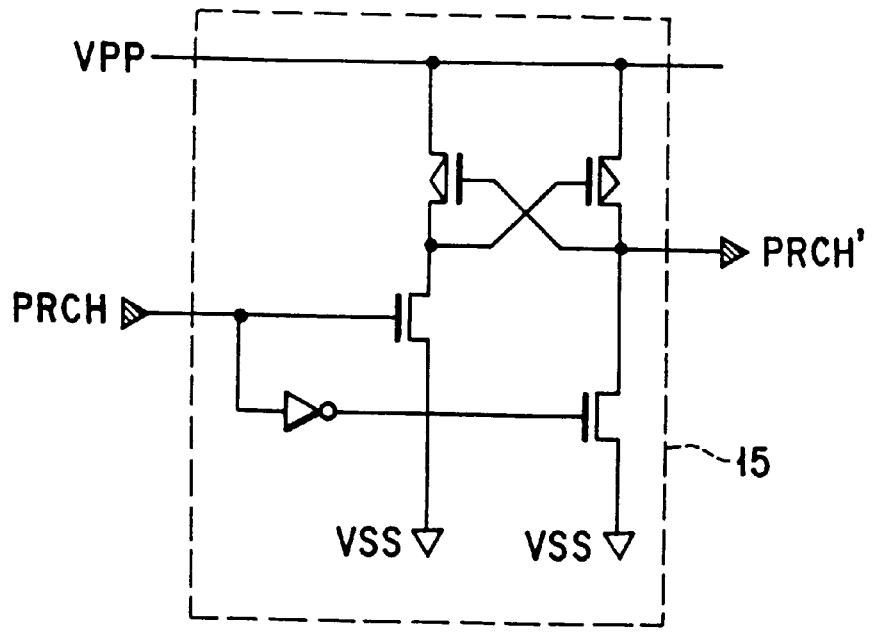
F I G. 5
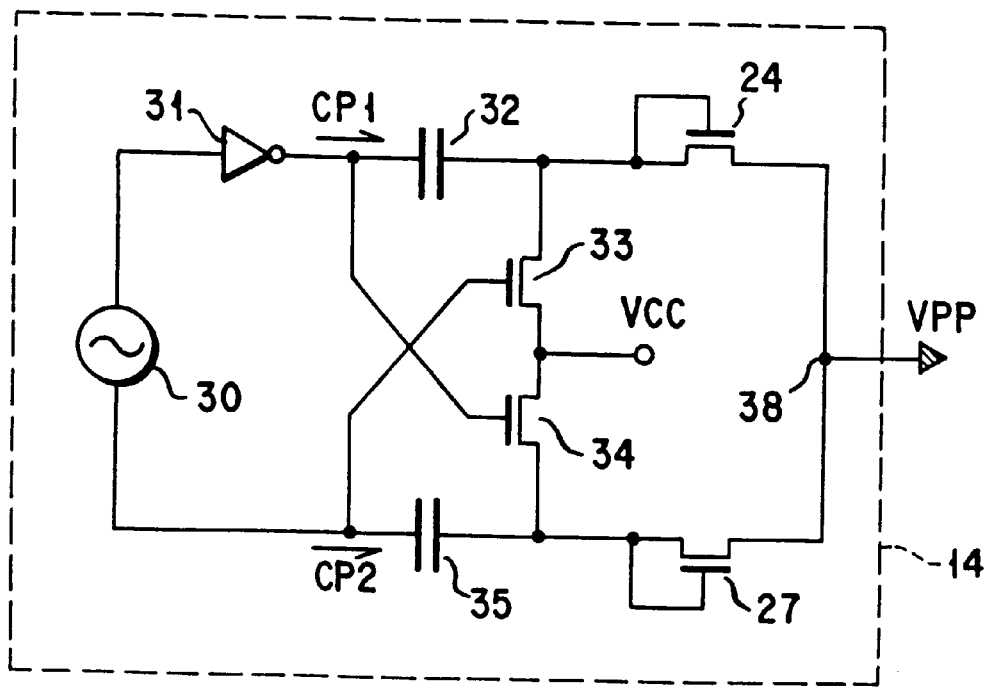
F I G. 6

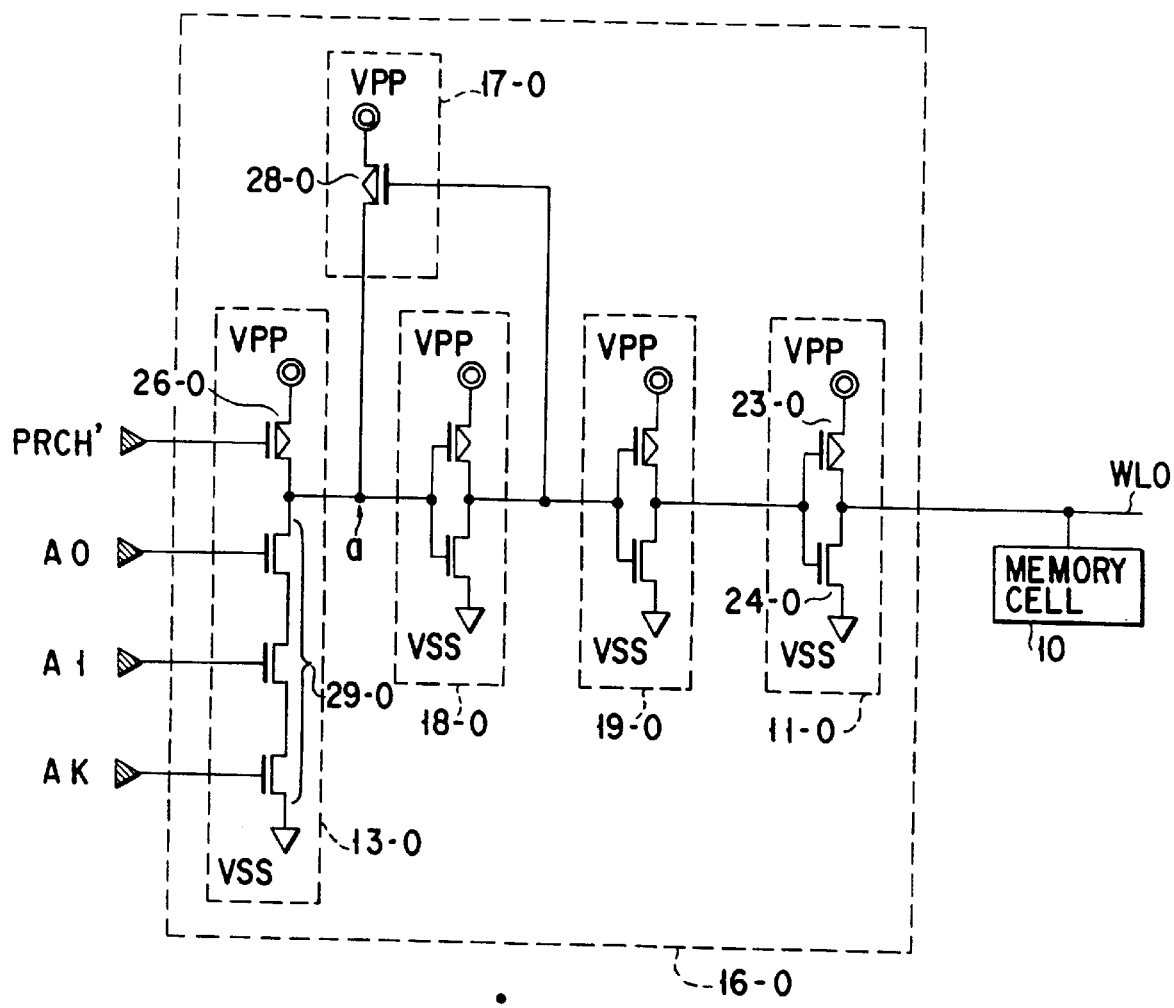
F I G. 7

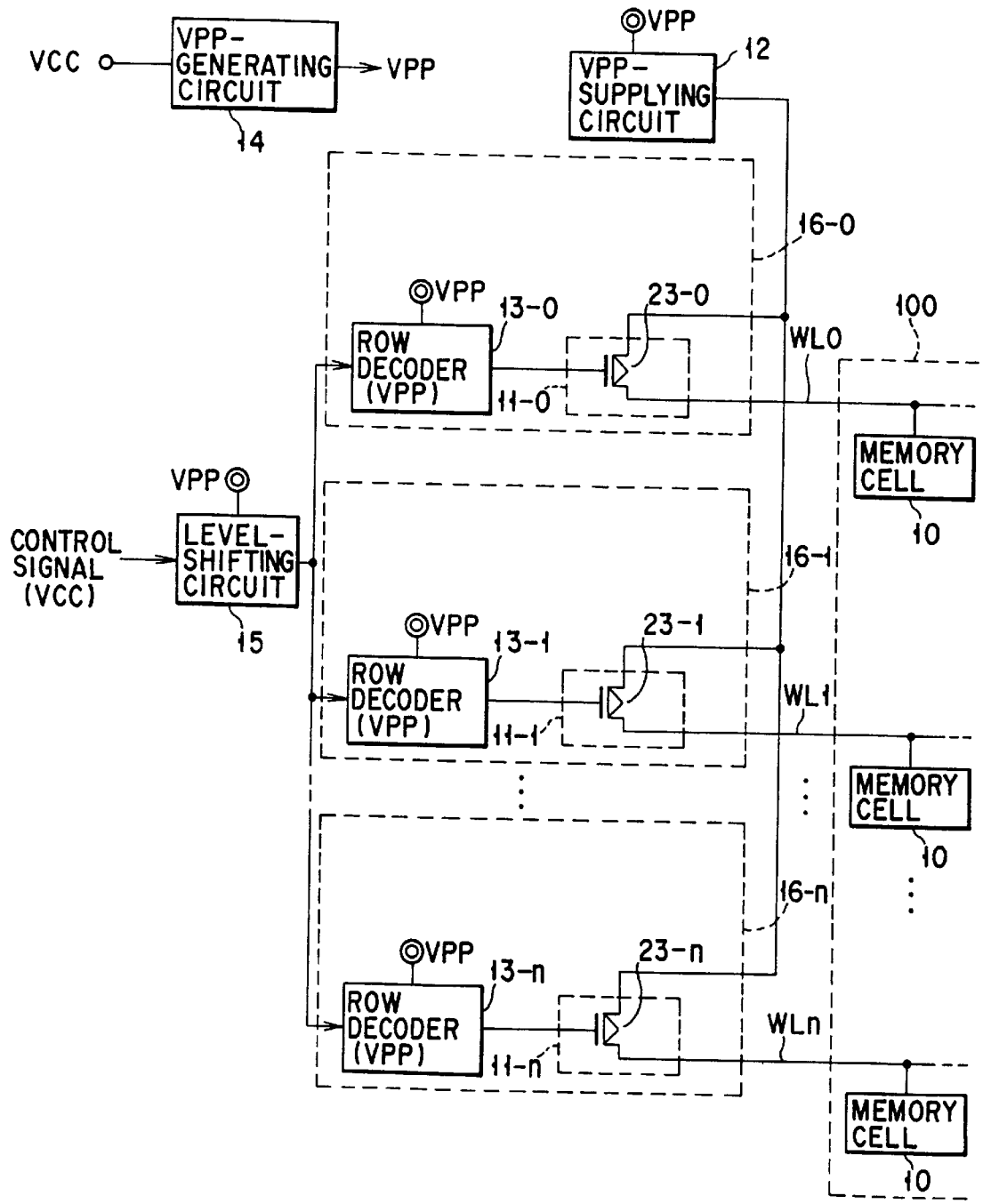
F I G. 8

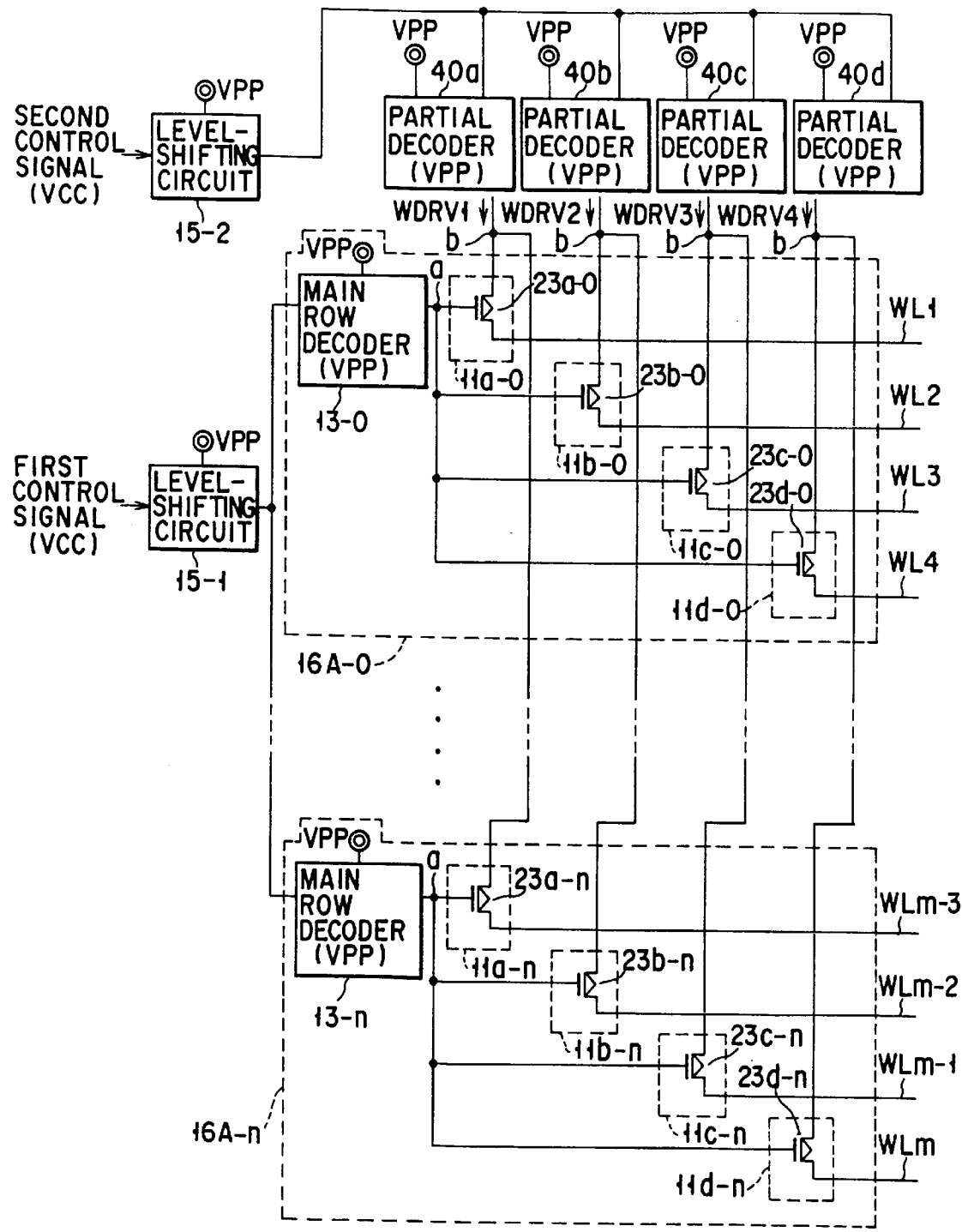
F I G. 9

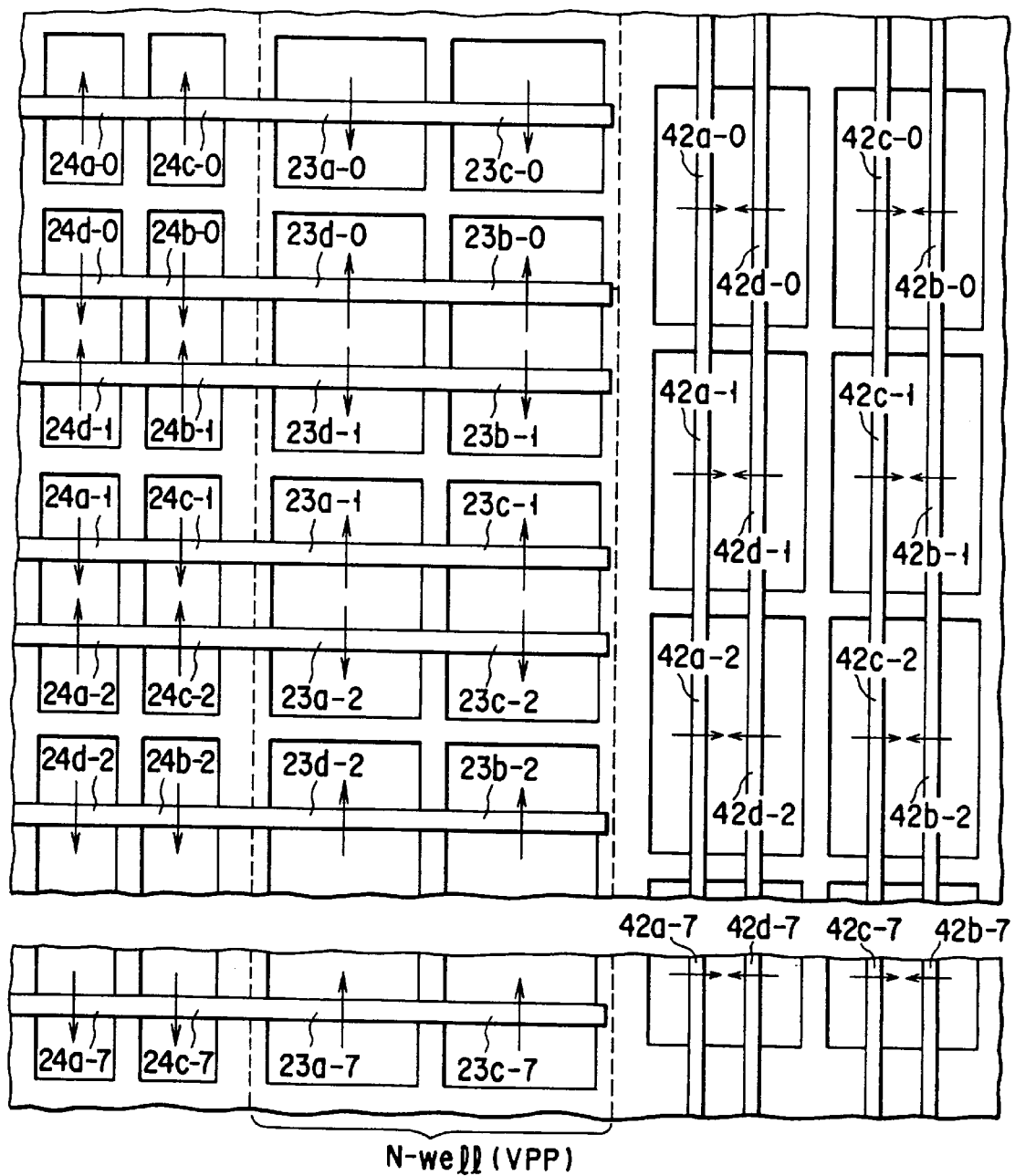
F I G. 14

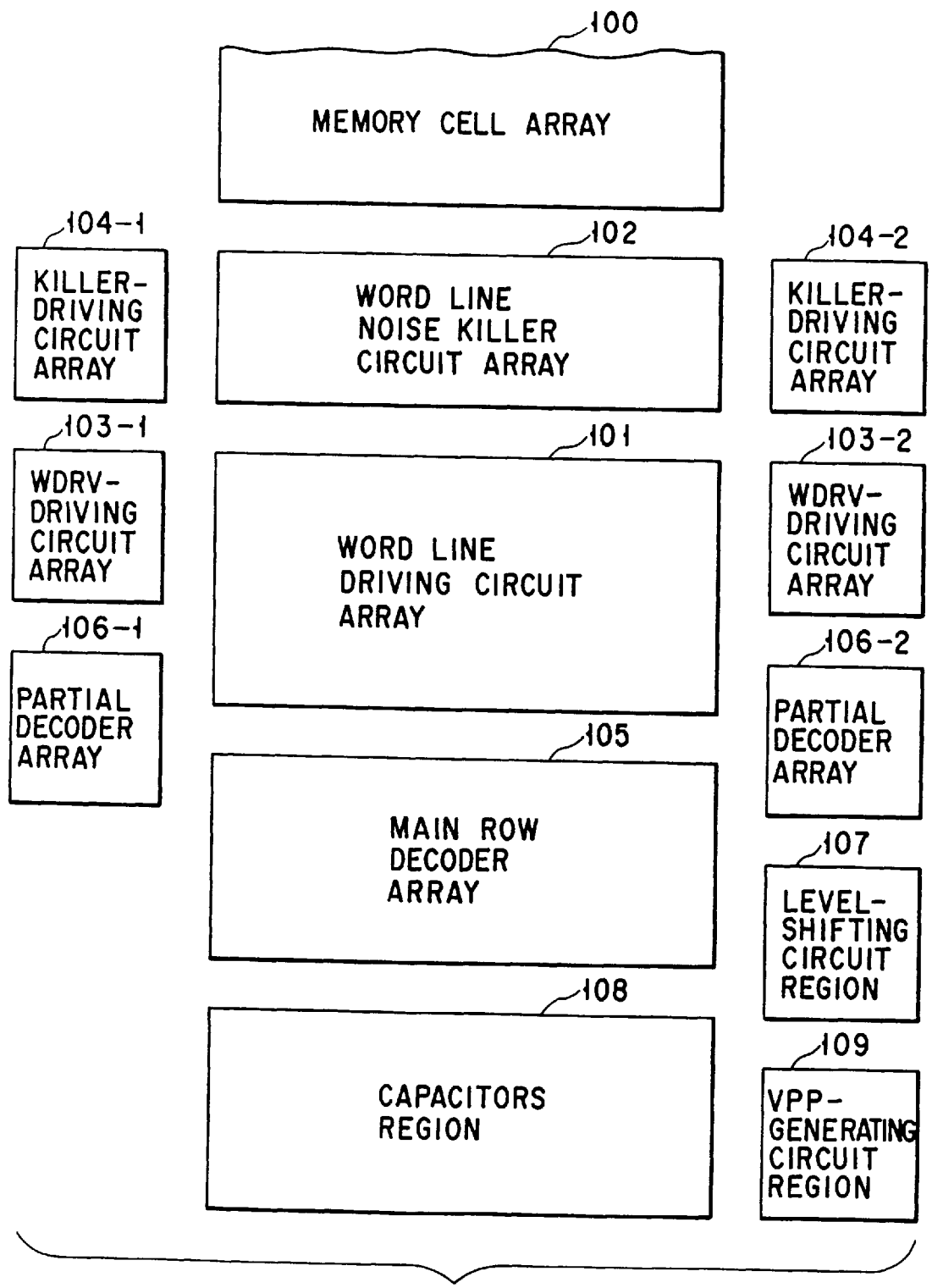
F I G. 20

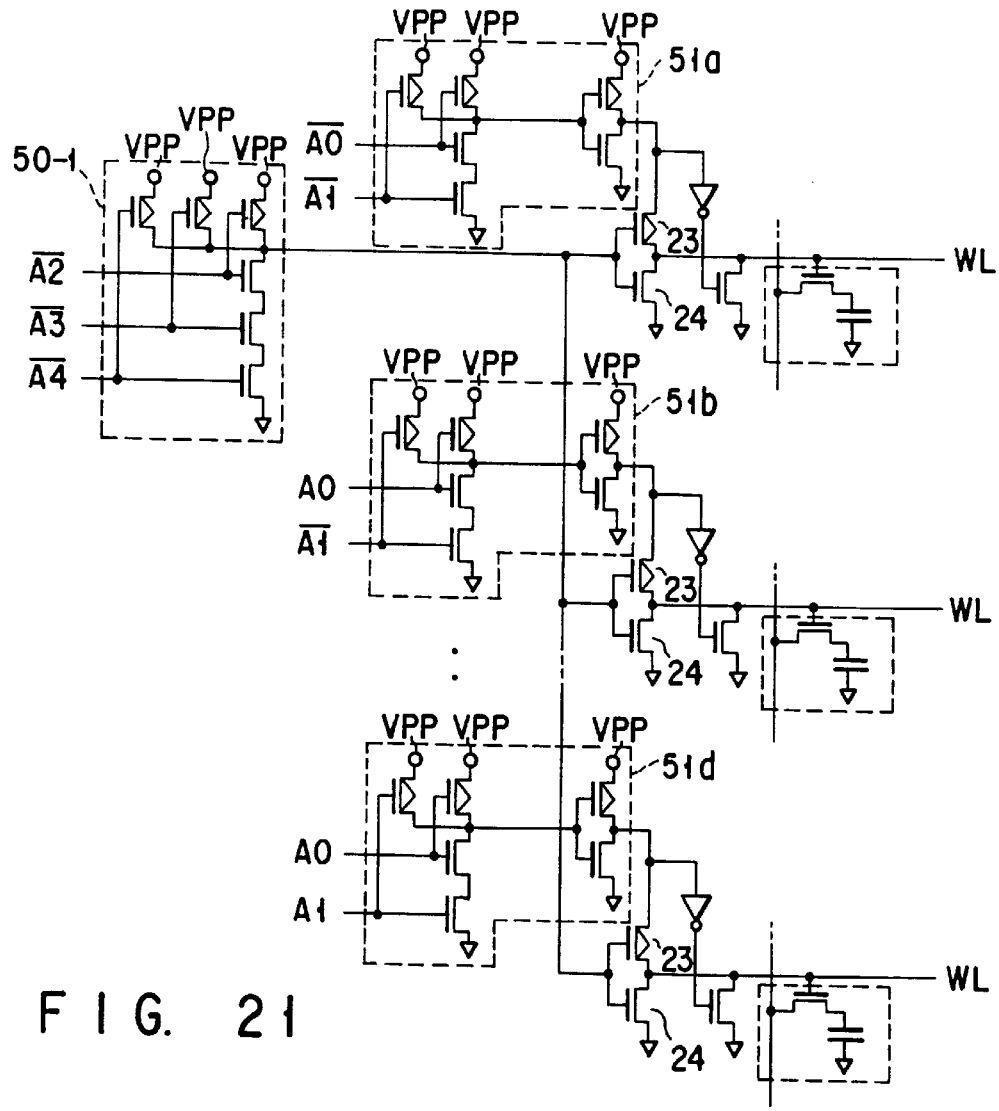
F I G. 21
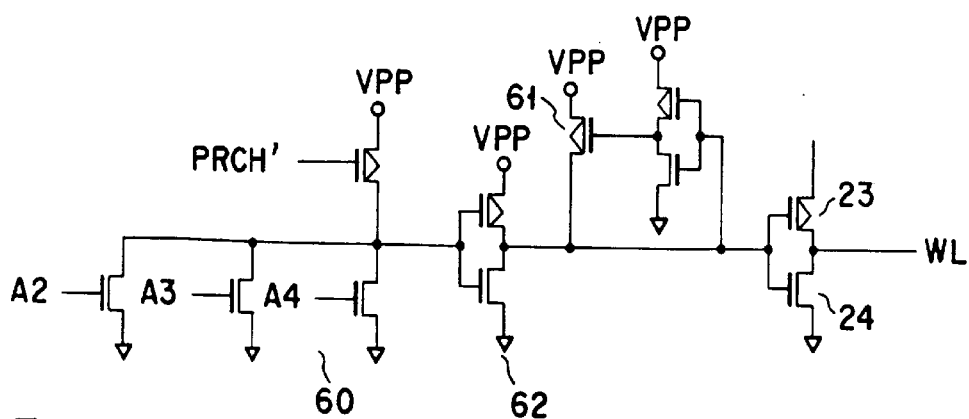
F I G. 22

SEMICONDUCTOR MEMORY DEVICE

The present application is a continuation of prior application Ser. No. 09/168,673, filed Oct. 9, 1998, which is a continuation of prior application Ser. No. 08/907,030, filed Aug. 6, 1997 (now U.S. Pat. No. 5,838,629), which is a divisional of prior application Ser. No. 08/696,738, filed Aug. 14, 1996 (now U.S. Pat. No. 5,793,695), which is a divisional of prior application Ser. No. 08/379,290, filed Jan. 27, 1995 (now U.S. Pat. No. 5,825,714).

BACKGROUND OF THE INVENTION

1. Field of the Invention

The present invention relates to a semiconductor memory device, and more particularly to a word-line selecting circuit for selecting and driving a word line.

2. Description of the Related Art

As the integration density of the semiconductor memory increases, it is increasingly demanded that the power-supply voltage VCC of the memory be reduced and that the data be read from the memory faster.

FIG. 1 shows conventional word-line selecting circuits which are identical and incorporated in a semiconductor memory. As illustrated in FIG. 1, each word-line selecting circuit has a P-channel MOS field-effect transistor (PMOSFET) and an N-channel MOS field-effect transistor (NMOSFET). A boosted potential VPP is applied to the source of the PMOSFET. The potential VPP is higher than the power-supply voltage VCC applied to the circuit from an external power supply. The potential VPP is generated by, in most cases, a boosted potential generating circuit (not shown) which is provided in the memory chip. A ground potential VSS is applied to the source of the NMOSFET.

The PMOSFET and the NMOSFET are connected at their drains. The node of the drains of the MOSFETs is connected to one end of a word line WL. Connected to the word line WL are memory cells, only one of which is shown in FIG. 1. The gates of the PMOSFET and the gate of the NMOSFET are connected to each other. The node of the gates is connected by a level-shifting circuit to a row decoder. The power-supply voltage VCC is applied to the row decoder. The row decoder is controlled by control signals such as address signals and precharge signals, to generate an output signal $S_{VCC}$ which is a VCC-based signal. The level-shifting circuit changes the level of the output signal to generate a VPP-based signal $S_{VPP}$ whose high level is equal to the VPP level. The signal $S_{VPP}$ is supplied to the gate of the PMOSFET and to the gate of the NMOSFET.

In the word-line selecting circuit of in FIG. 1, the PMOSFET is provided between the word line WL and the boosted potential VPP terminal in order to drive the word line WL. The PMOSFET is used in place of a boot-strap circuit which is incorporated in the ordinary word-line selecting circuit. The boot-strap circuit is comprised of an NMOSFET for driving a word line and an isolation transistor, in order to lower the power-supply voltage and shorten the time for selecting a word line.

With the word-line selecting circuit of in FIG. 1, wherein the PMOSFET is used in place of a boot-strap circuit, it is required that the control signal supplied to its gate be a VPP-based signal whose high level is equal to the VPP level. This is because the PMOSFET would not be turned off completely by a VCC-based signal at its high level (i.e., the VCC level) since the source voltage of the PMOSFET is set at the boosted potential VPP. Although the PMOSFET must be controlled by a VPP-based signal, the output signal of the row decoder is a VCC-based one. It is therefore necessary to convert the VCC-based signal to a VPP-based signal. This is why the level-shifting circuit is indispensable to the word-line selecting circuit shown in FIG. 1.

A memory device of this type is disclosed in, for example, U.S. Pat. No. 4,344,005.

U.S. Pat. No. 4,344,005 also discloses a word-line killer circuit as well as a level-shifting circuit. The word-line killer circuit sets a word line at the ground potential when a boosted potential VPP is applied to another word line. The word-line killer circuit is driven by a killer-driving circuit. Like the level-shifting circuit, the killer-driving circuit uses the boosted potential VPP as power-supply voltage.

FIG. 2 shows another conventional word-line selecting circuit. This circuit includes two PMOSFETs (shown in the broken-line box LS) which correspond to the level-shifting circuit used in the circuit of FIG. 1. The PMOSFETs are incorporated in the row decoder section for one word line and have their gates cross-connected.

A memory device of this type is disclosed in, for example, IEEE Journal of Solid-State Circuits, Vol. 26, No. 8, August 1991, pp. 1171–1175.

Jpn. Pat. Appln. KOKAI Publication No. 4-106794 discloses an EPROM. In the EPROM, address signals are level-shifted before they are input to a row decoder.

The use of the two types of the conventional word-line selecting circuits, both described above, is disadvantageous in the following respects.

The memory devices shown in FIGS. 1 and 2 need to have a number of level-shifting circuits. This is because each word-line selecting circuit must be provided with one level-shifting circuit. More precisely, exactly as many level-shifting circuits as the word lines are required in the memory devices of FIGS. 1 and 2.

Similarly, a memory device wherein address signals are level-shifted before they are input to a row decoder must have a number of level-shifting circuits. This is because one level-shifting circuit needs to be provided for each address-signal line.

The greater the number of level-shifting circuits provided, the larger the chip size. Further, the larger the number of level-shifting circuits, the greater the consumption of power used to generate the boosted potential VPP. This is because each level-shifting circuit uses the boosted potential VPP as power-supply voltage.

The consumption of power used to generate the boosted potential VPP increases also when circuits using the boosted potential VPP as power-supply voltage are provided in chips in large numbers.

As the consumption of power used to generate the potential VPP increases, the boosted potential VPP is more likely to vary. In particular, a low boosted potential VPP tends to vary lower. To suppress the the variation of the potential VPP, a sufficiently high potential must be applied to the boosted potential line. In order to apply such a potential to the boosted potential line, the capacitor incorporated in the boosted-potential generating circuit needs to have a large area. The larger the area of the capacitor, the larger the chip size.

Third, the level-shifting circuit may cause errors since it must be located adjacent to the memory-cell region due to the chip-layout and is inevitably influenced by the noise generated in the memory-cell array. The higher the integration density of the memory, the greater the influence the noise imposes on the level-shifting circuit. The word-line selecting circuit is very likely to cause errors if incorporated in a 64-MB or 256-MB dynamic RAM.

SUMMARY OF THE INVENTION

In view of the foregoing, a first object of this invention is to provide a semiconductor memory device which has a relatively small peripheral-circuit region and consumes relatively little power.

A second object of the present invention is to provide a semiconductor memory device which not only has a relatively small peripheral-circuit region and consumes relatively little power, but is also less susceptible to influence by noise and can operate reliably.

To attain the first object, according to a first aspect of the present invention a semiconductor memory device is provided having a plurality of row decoders, each connected to receive a precharge signal and address signals, the precharge signal having been level-shifted.

Since the precharge signal is level-shifted before being supplied to each row decoder, the row decoder need not incorporate a level-shifting circuit. Hence, the semiconductor memory device has fewer level-shifting circuits than the conventional semiconductor memory device. As a result, the devices can have a smaller chip size and can operate at a lower power consumption particularly for the boosted potential than the conventional semiconductor memory device.

The level-shifting of the precharge signal provides another advantage. Were each address signal level-shifted, a long time would elapse between the generation of the signal and the input of the signal to the row decoder, inevitably decreasing the speed of the semiconductor memory device. In the case where the precharge signal is level-shifted as in the memory device of this invention, it suffices to precharge or discharge the row decoder in order to input the address signal to the row decoder. The address signal can be quickly input to the row decoder, enabling the memory device to operate at high speed.

The level-shifting circuits are susceptive to the influence of noise because of their structure. Where they are located close to the memory-cell region, where noise will likely be generated, they might cause errors. Since they are arranged far from the memory-cell region in the present invention, they are scarcely affected by the noise generated in the memory-cell region, and therefore operate without causing errors.

To achieve the first object, according to a second aspect of the present invention a semiconductor memory device is provided in which a plurality of row decoders and a plurality of partial decoders exist. The row decoders are connected to receive a precharge signal and address signals. The partial decoders are connected to receive a precharge signal and address signals, which are different from those supplied to the row decoders. The precharge signals are ones which have been generated by level-shifting a signal.

The semiconductor memory device according to the second aspect can have the same advantages as the memory device according to the first aspect.

To achieve the second object described above, according to a third aspect of the invention a semiconductor memory device has a plurality of row decoders, a plurality of partial decoders and a plurality of word-line noise killer circuits. The row decoders are connected to receive a precharge signal and address signals. The partial decoders are connected to receive a precharge signal and address signals, which are different from those supplied to the row decoders. The precharge signals are ones which have been generated by level-shifting a signal. The word-line noise killer circuits are controlled by inverted signals which are substantially the outputs of the partial decoders. The inverted signals are generated by a circuit which is driven by the power-supply potential, not by a boosted potential.

The semiconductor memory device according to the third aspect offers the same advantages as the memory device according to the first aspect. Furthermore, it is advantageous in that the power required to generate the boosted potential can be reduced since the circuit for generating the inverted signals is driven by the power-supply potential, not by a boosted potential.

To achieve the second object described above, according to a fourth aspect of the invention there is provided a semiconductor memory device which comprises an array of memory cells, an array of word-line driving circuits and an array of word-line noise killer circuits. The array of the word-line noise killer circuits is arranged between the the array of memory cells and the array of the word-line driving circuits.

With this memory device, the word-line driving circuits can be sufficiently spaced from the array of memory cells, without increasing the chip size of the device. The noise interference between each word-line driving circuit and the memory cell array can therefore be suppressed, minimizing the possibility that the memory device generates errors.

To achieve the second object described above, according to a fifth aspect of the invention a semiconductor memory device is provided with an array of memory cells, a plurality of word-line driving circuits and a plurality of word-line noise killer circuits. The N-channel, gate-insulated FETs included in the word-line noise killer circuits have their gates extending at right angles to the gates of the P-channel, gate-insulated FETs and N-channel, gate-insulated FETs which are incorporated in the word-line driving circuits.

With the memory device according to the fifth aspect, the word lines can extend substantially straight, from the word-line driving circuits to the array of memory cells. Because they are substantially straight, the word lines can be formed easily.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a circuit diagram of the level-shifting circuit shown in FIG. 3;

FIG. 6 is a circuit diagram of the VPP-generating circuit shown in FIG. 3;

FIG. 7 is a circuit diagram showing a modification of the word-line selecting circuits illustrated in FIG. 4;

FIG. 8 is a block diagram showing the VPP-generating circuit, level-shifting circuit, word-line selecting circuits and memory cells, all incorporated in a dynamic RAM according to a second embodiment of this invention;

FIG. 9 is a block diagram showing the level-shifting circuits, word-line selecting circuits and partial decoders, all incorporated in a dynamic RAM according to a third embodiment of the invention;

FIG. 14 is a diagram showing the array of the word-line driving circuits and the array of word-line noise killer circuits, both incorporated in the dynamic RAM of FIG. 10;

FIG. 20 is a diagram showing the chip layout of the memory block of the dynamic RAM shown in FIG. 10;

FIG. 21 is a circuit diagram illustrating a dynamic RAM according to a fifth embodiment of the present invention; and FIG. 22 is a circuit diagram showing a word-line selecting circuit of a type which can be incorporated in the dynamic RAM illustrated in FIG. 21.

DETAILED DESCRIPTION OF THE PREFERRED EMBODIMENTS

Figure 1:
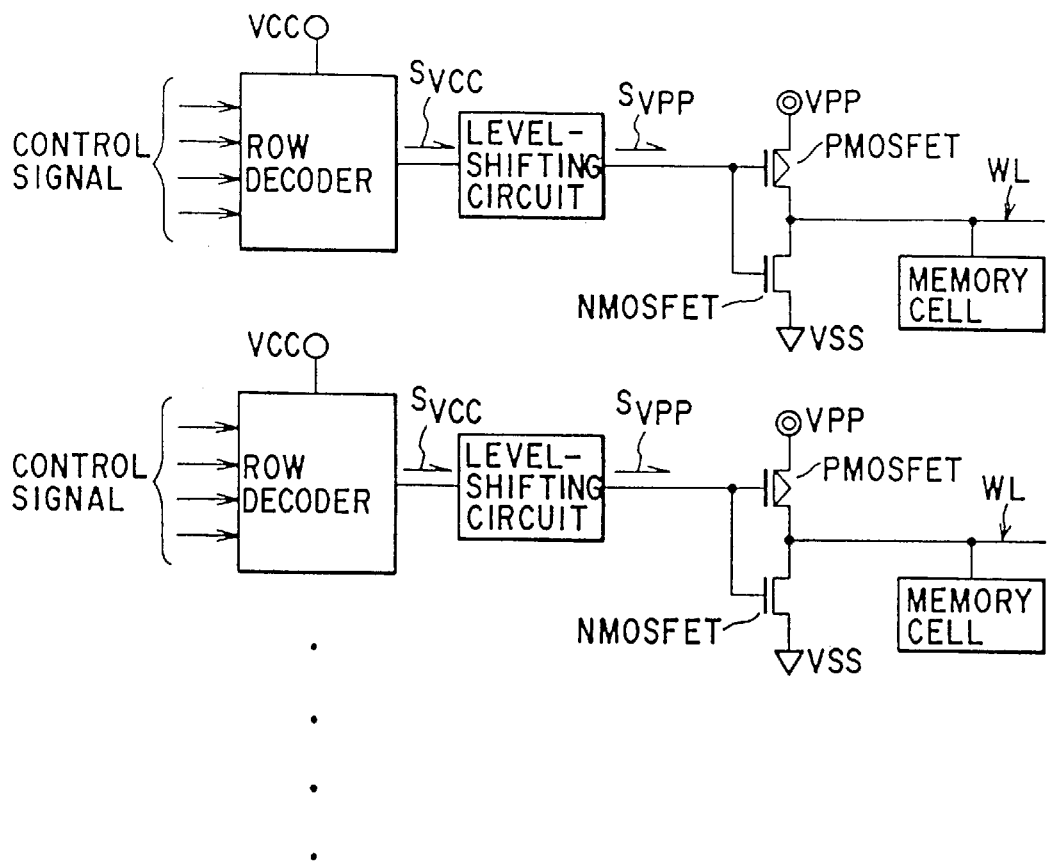
FIG. 1 is a block diagram showing conventional word-line selecting circuits which are identical and incorporated in a semiconductor memory.

Embodiments of the invention will now be described, with reference to the accompanying drawings. In the drawings, identical reference numerals denote the same component, which will not be repeatedly explained in the following description.

The present invention can be applied to various types of semiconductor memories, such as the dynamic RAM, the static RAM, the erasable programmable ROM, the mask ROM. Nonetheless, the invention is particularly suitable for a dynamic RAM. Some dynamic RAMs will be described below, which are embodiments of the present invention.

Figure 3:
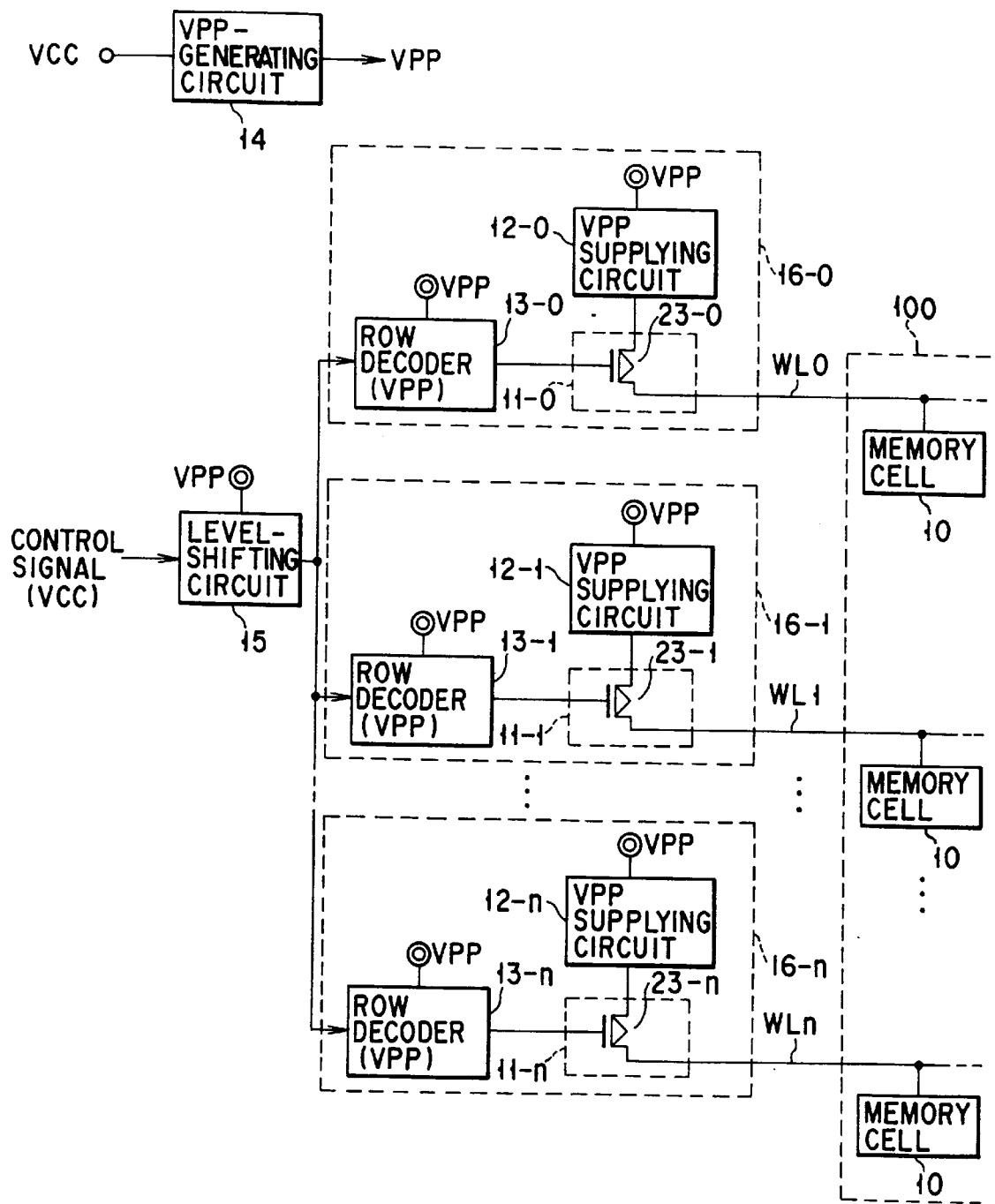
FIG. 3 is a block diagram showing the VPP-generating circuit, level-shifting circuit, word-line selecting circuits and memory cells, all incorporated in a dynamic RAM according to a first embodiment of this invention.

FIG. 3 shows a dynamic RAM according to a first embodiment of the invention. More precisely, FIG. 3 is a block diagram showing a VPP-generating circuit 14, a level-shifting circuit 15, word-line selecting circuits 16-0 to 16-n, and memory cells 10—all included in the dynamic RAM.

As shown in FIG. 3, memory cells 10 are connected to each of word lines WL0 to WLn. The word-line selecting circuits 16-0 to 16-n are connected to the word lines WL0 to WLn, respectively. Each word-line selecting circuit has a row decoder (hereinafter referred to as "VPP-based row decoder) 13, a boosted potential supplying circuit (hereinafter referred to as "VPP-supplying circuit) 12 and a word-line driving circuit 11.

Each of the word-line driving circuits 11-0 to 11-n includes a P-channel MOS field-effect transistor (hereinafter referred to as "PMOSFET") 23. The drain of the PMOSFET 23 is connected to the word line WL. That is, the PMOSFETs 23-0 to 23-n have their drains connected to the word lines WL0 to WLn, respectively. The sources of the PMOSFETs 23-0 to 23-n are connected to the VPP-supplying circuits 12-0 to 12-n, respectively. The circuits 12-0 to 12-n are connected to the VPP-generating circuit 14 which is incorporated in the memory chip. The VPP-generating circuit 14 generates a boosted potential VPP from the power-supply voltage VCC applied to it. The boosted potential VPP is higher than the power-supply voltage VCC. Thus, the VPP-supplying circuits 12-0 to 12-n can supply the boosted potential VPP to the sources of the PMOSFETs 23-0 to 23-n.

The VPP-supplying circuits 12-0 to 12-n may be replaced by lines. If this is the case, the boosted potential VPP will be applied to the sources of the PMOSFETs 23-0 to 23-n as long as the dynamic RAM operates. Alternatively, each VPP-supplying circuit 12 may include a switching transistor, and a partial decoder may be connected to the gate of the switching transistor. In this case, the transistor will be turned on when selected by the partial decoder, thereby applying the boosted potential VPP to the source of the PMOSFET 23 used in the word-line driving circuit 11.

The PMOSFETs 23-0 to 23-n have their gates connected to the VPP-based row decoders 13-0 to 13-n, respectively, and are controlled by the signals output from the row decoders 13-0 to 13-n. A circuit element such as an inverter may be provided between each VPP-based row decoder 13 and the PMOSFET 23, in which case the PMOSFET 23 is controlled by a signal corresponding to the output signal of the row decoder 13. The VPP-based row decoders 13-0 to 13-n are controlled is by a control signal, such as a precharge signal or an address signal. In the present invention, it is important that the control signal is a VPP-based one whose high level is equal to the VPP level. The VPP-based control signal is a signal the level-shifting circuit 15 has generated by shifting a VCC-based control signal whose high level is equal to the VCC level.

In the dynamic RAM of FIG. 3, the control signal input to the VPP-based row decoders 13-0 to 13-n is a VPP-based one which the level-shifting circuit 15 has generated by converting a VCC-based control signal. The dynamic RAM need not have a plurality of level-shifting circuits, each provided for one word-line selecting circuit, as in the circuits illustrated in FIGS. 1 and 2. Only one level-shifting circuit is required to control a plurality of VPP-based row decoders 13-0 to 13-n. Therefore, the dynamic RAM of FIG. 3 can have a low chip size and operate at small power dissipation.

Figure 2:
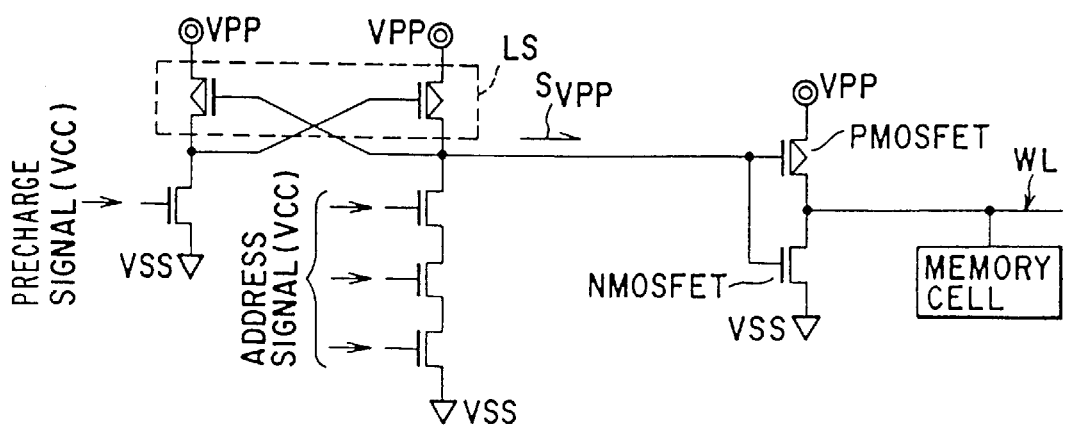
FIG. 2 is a circuit diagram illustrating another conventional word-line selecting circuit for use in a semiconductor memory.

In the dynamic RAM of FIG. 3, the level-shifting circuit 15 need not be located in any word-line selecting circuit 16, unlike in the circuits illustrated in FIGS. 1 and 2. Rather, the circuit 15 is positioned far from the memory cell array, which is likely to generate noise. The level-shifting circuit 15 is scarcely affected by the noise generated by the memory-cell array. The circuit 15 does not cause errors even if a relatively large noise is generated in the memory-cell array. On the other hand, as described above, the word-line selecting circuit may cause errors as do the circuits shown in FIGS. 1 and 2, because it must be provided near the memory-cell array due to the chip-element arrangement. The higher the integration density of the memory, the more influence the noise generated in the memory-cell region will have on the level-shifting circuit. The word-line selecting circuits of FIGS. 1 and 2 are very likely to cause errors if incorporated in a 64-MB or 256-MB dynamic RAM.

The farther the level-shifting circuit 15 is located from the word-line selecting circuits 16-1 to 16-n, the less the influence of the noise generated in the memory-cell region, but the longer the lines connecting the circuit 15 to the word-line selecting circuits 16-0 to 16-n. Here arises a problem. The longer the lines, the greater their parasitic capacitance, and the lower the operating speed of the word-line selecting circuits 16-0 to 16-n. It is desirable that the memory-cell region be arranged at one side of the substrate region in which the circuits 16-0 to 16-n are provided, so as to shorten the word lines WL0 to WLn as much as possible, thereby to prevent an increase in the parasitic capacitance of each word line. Also is it desirable that the level-shifting circuit 15 be arranged at another side (preferably the opposite side) of that substrate region and adjacent to the word-line selecting circuits 16-0 to 16-n.

The word-selecting circuit region is arranged between the level-shifting circuit region and the memory-cell region in the dynamic RAM shown in FIG. 3. The level-shifting circuit 15 is therefore spaced apart from the memory cells 10 by the substrate region in which the word-line selecting circuits 16-0 to 16-n are provided. The level-shifting circuit 15 is reliably prevented from being influenced by the noise generated in the memory-cell region. Furthermore, the lines connecting the circuit 15 to the word-line selecting circuits 16-0 to 16-n are relatively short, not decreasing the operating speed of the word-line selecting circuits 16-0 to 16-n. In addition, the dynamic RAM can have a reduced chip size.

Figure 4:
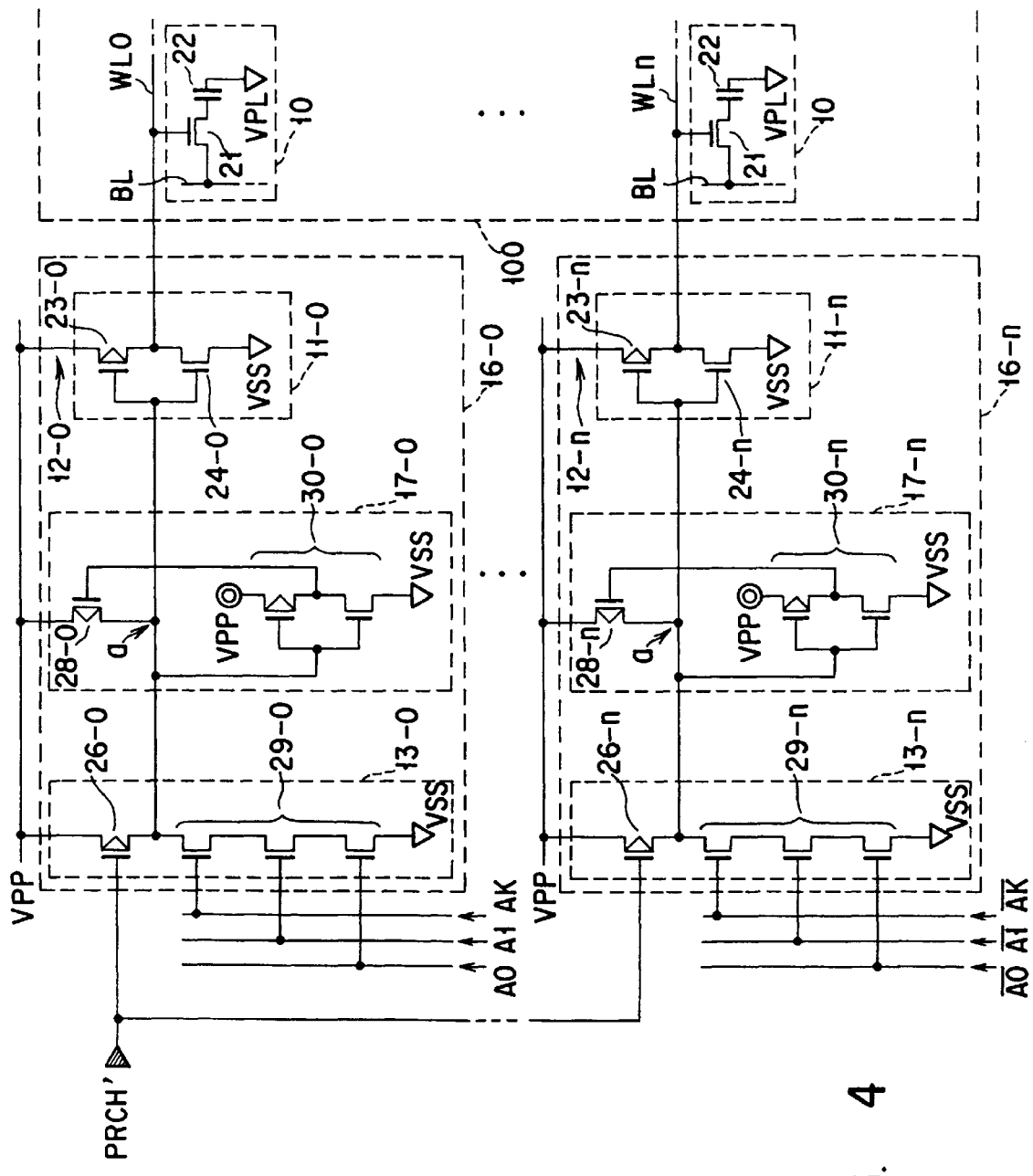
FIG. 4 is a circuit diagram of the word-line selecting circuits shown in FIG. 3.

The VPP-generating circuit 14, the level-shifting circuit 15, the word-line selecting circuits 16-0 to 16-n and the memory cells 10—all incorporated in the dynamic RAM which is the first embodiment of this invention—will be described in greater detail with reference to FIGS. 4, 5 and 6. FIG. 4 is a circuit diagram of the word-line selecting circuits 16-0 to 16-n. FIG. 5 is a circuit diagram of the level-shifting circuit 15. FIG. 6 is a circuit diagram of the VPP-generating circuit 14.

As shown in FIG. 4, memory cells 10 are connected to each of the word lines WL0 to WLn. Each memory cell 10 is a dynamic RAM cell including one transistor 21 and one capacitor 22. Each word line WL is connected to the word-line driving circuit 11 (11-0, 11-1, . . . 11-n) included in the word-line selecting circuit 16 (16-0, 16-1, . . . 16-n) provided for selecting the word line WL.

Each word-line selecting circuit 16 will be described. As can be understood from FIG. 4, the word-line driving circuit 11 includes a PMOSFET 23 (23-0, 23-1, . . . or 23-n) and an NMOSFET 24 (24-0, 24-1, . . . or 24-n). The drain of the PMOSFET 23 is connected to the drain of the NMOSFET 24. A boosted potential VPP is applied to the source of the PMOSFET 23, whereas a ground potential VSS is applied to the source of the NMOSFET 24. The line connecting the source of the PMOSFET 23 to the boosted potential VPP corresponds to the VPP-supplying circuit 12 which is illustrated in FIG. 3. The gate of the PMOSFET 23 and the gate of the NMOSFET 24 are connected to each other. The node of the gates of these MOSFETs 23 and 24 is connected to the output node a of the VPP-based row decoder 13.

The VPP-based row decoder 13 is connected at one end to the boosted potential VPP and the ground potential VSS. It comprises a PMOSFET 26 (26-0, 26-1, . . . 26-n) and a decoder circuit 29 (29-0, 29-1, . . . 29-n) which are connected in series. The PMOSFET 26 is a precharging transistor, and the decode circuitly 29 is an NAND gate. The PMOSFET 26 is controlled by a precharge signal PRCH', and the decode circuitly 29 is controlled by controlled by row-address signals A0 to Ak or row-address signals /A0 to /Ak. The row-address signals /A0 to /Ak have been obtained by inverting the signals A0 to Ak, respectively.) The precharge signal PRCH' is a VPP-based control signal which the level-shifting circuit 15 has generated by level-shifting a VPP-based control signal PRCH.

As shown in FIG. 4, each word-line selecting circuit 16 has a noise killer circuit 17 (17-0, 17-1, . . . or 17-n). The noise killer circuit 17 is connected to the output node a of the VPP-based row decoder 13. The circuit 17 comprises a load PMOSFET 28 (28-0, 28-1, . . . or 28-n) and an inverter 30 (30-0, 30-1, . . . 30-n). The PMOSFET 28 has its source connected to the boosted potential VPP and its drain connected to the output node a. The inverter 30 has its input terminal connected to the boosted potential VPP and is designed to invert the potential level at the output node a and apply it to the gate of the PMOSFET 28.

The level-shifting circuit 15 has the structure illustrated in FIG. 5. As can be understood from FIG. 5, the circuit 15 is designed to shift the level of the VPP-based control signal PRCH, thereby generating a precharge signal PRCH'. The precharge signal PRCH', which is also a VPP-based control signal, is supplied to the PMOSFET 26 of the VPP-based row decoder 13, thus controlling the PMOSFET 26.

As shown in FIG. 6, the VPP-generating circuit 14 comprises a clock signal generator 30, an inverter 31, a first voltage-raising capacitor 32, a first MOSFET 33, a second MOSFET 34, a second voltage-raising capacitor 35, two other MOSFETs 24 and 27 and an output terminal 38. The clock signal generator 30 generates a clock signal CP2, which is supplied to the inverter 31. The inverter 31 inverts the clock pulse CP2, generating a clock signal CP1 which is complementary to the clock signal CP2. The clock signal CP1 is supplied to one end of the first voltage-boosting capacitor 32. The first MOSFET 33 is connected between a terminal for applying the power-supply voltage VCC and the first voltage-boosting capacitor 32, and has its gate connected to receive the clock signal CP2 generated by the clock signal generator 30. The second MOSFET 34 is connected between the terminal for applying the power-supply voltage VCC and the second voltage-boosting capacitor 35, and has its gate connected to receive the clock signal CP1 generated by the inverter 31. The MOSFET 24 has its drain and gate connected to the node of the first MOSFET 33 and the first voltage-boosting capacitor 32. The source of the MOSFET 24 is connected to the output terminal 38. The MOSFET 27 has its drain and gate connected to the node of the second MOSFET 34 and the second voltage-boosting capacitor 35. The source of the MOSFET 27 is connected to the output terminal 38.

The VPP-generating circuit 14 is of the type which is generally used to drive the word lines of dynamic RAMs. It generates a boosted potential VPP, which is supplied to the word-line selecting circuits 16-0 to 16-n through power-supply lines.

The operation of each word-line selecting circuit 16 will now be explained, with reference to FIG. 4.

Before the row-address signals A0 to Ak or /A0 to /Ak are input to the NAND gate (decode circuitly) 29, the precharge signal PRCH', i.e., a VPP-based control signal, is changed within a predetermined time, i.e., a precharging time, from the high level to the low level, and back to the high level. To be more precise, the signal PRCH' is changed from the VPP level to the VSS level, and back to the VPP level. The PMOSFET 26 is turned on when the signal PRCH' changes to the VSS level, and is turned off after the output node a is charged to the VPP level.

The PMOSFET 28 prevents the potential level at the output node a from changing due to noise or the like, when the PMOSFET 26 is turned off, temporarily setting the output node a in a floating state. The inverter 30, whose output is connected to the gate of the PMOSFET 28, includes a PMOSFET and an NMOSFET which are connected in series between the boosted potential VPP and the ground potential VSS. The boosted potential VPP is used as the power-supply voltage of the inverter 30, for the following reason. Were the boosted potential VPP replaced by the power-supply voltage VCC, the PMOSFET incorporated in the inverter 30 could not be turned off completely when the output node a is at the high potential level. Should this happen, the inverter would fail to operate reliably, making it difficult to drive the word line WL at sufficiently high speed.

After the lapse of the predetermined time (i.e., the precharging time), the address signals A0 to Ak or /A0 to /Ak are input, in a particular combination, to the NAND gate 29. Then, only the output node a is set at the VSS level if the word line WL connected to the word-line driving circuit 11 has been selected. The PMOSFET 23 is turned on, whereas the NMOSFET 24 is turned off. As a result, the potential of the word line WL selected rises to the VPP level. The transistors 21 of the memory cells 10 connected to the word line WL are turned on. The data stored in the capacitors 22 of the memory cells 10 is thereby transferred to the bit lines (not shown) of the dynamic RAM.

Assume that the word line WL connected to the word-line driving circuit 11 has not been selected. In this case, the output node a remains at the VPP level. The PMOSFET 23 is turned off, whereas the NMOSFET 24 is turned on. The potential of the word line WL not selected does not rise to the VPP level. Consequently, no data is read from the memory cells 10.

The NMOSFET 24 is on while the word line WL remains unselected, so as to fix the potential of the word line at zero level. Namely, the NMOSFET 24 prevents the word line WL from assuming a floating state. Hence, the word line WL is reliably prevented from being selected erroneously even if its potential varies due to noise.

Of the signals for controlling the VPP-based row decoder 13, only the precharge signal PRCH', which is a VPP-based control signal, has been generated by level-shifting the precharge control signal PRCH and is supplied to the PMOSFET 26 of the VPP-based row decoder 13. The row-address signals A0 to Ak or /A0 to /Ak, which are supplied to the gates of the NMOSFETs constituting the NAND gate 29 are VCC-based control signals, unlike the precharge signal PRCH'. This is because any signal for controlling a PMOSFET must be a VPP-based control signal, while any signal for controlling an NMOSFET need not be a VPP-based control signal. An PMOSFET cannot be turned off completely when controlled by a VCC-based signal which is at its high level (i.e., the VCC level). By contrast, an NMOSFET is completely turned off when controlled by a VCC-based signal which is at its low level (i.e., the VSS level).

Needless to say, the NMOSFETs of the NAND gate 29 may be controlled by VPP-based control signals, causing no malfunction of the VPP-based row decoder 13. In other words, all signals controlling the word-line selecting circuit 16 can be VPP-based control signals. It is necessary, however, to use VPP-based signals to control at least the PMOSFETs incorporated in the word-line selecting circuit 16.

As mentioned above, the PMOSFET 26 of the row decoder 13 is used as a precharging transistor. This is because the threshold voltage of a PMOSFET hardly decrease, while that of an NMOSFET is likely to decrease. Thus, the PMOSFET 26 effectively functions as a precharging transistor.

In the dynamic RAM illustrated in FIG. 3, at least one of the signals controlling each word-line selecting circuit 16 (e.g., the signal controlling any PMOSFET) must be a VPP-based control signal. How the VPP-based control signal should be generated is not essential.

The dynamic RAM shown in FIG. 3 needs only one level-shifting circuit, i.e., the circuit 15. For level-shifting the precharge control signal PRCH, thereby to generate the precharge signal PRCH' which is a VPP-based control signal. As many level-shifting circuits as the word-line selecting circuits need not be used as in the conventional semiconductor memory which has the word-line selecting circuits of the type shown in FIG. 1 or FIG. 2. Requiring only one level-shifting circuit, the dynamic RAM of FIG. 3 can have a smaller chip size and operate at lower power consumption than the conventional semiconductor memory. Moreover, the dynamic RAM can operate reliably, making virtually no errors, as has been explained with reference to FIG. 3.

In the dynamic RAM shown in FIG. 3, each word-line selecting circuit 16 requires only two power supplies, i.e., the boosted potential VPP and the ground potential VSS. It does not need the potential VCC since no VCC lines are formed in the substrate region where the word-line selecting circuit is formed. In this substrate region there is provided only two power-supply lines, i.e., a VSS line and a VPP line. The VSS line and the VPP lines can be made broader than in the case where a VCC line is formed also in that substrate region. If the VSS line and the VPP line have a sufficient width, their potential levels can be prevented from varying due to noise or the like. In addition, it would be easier to design the circuit configuration than in the case where a VCC line is provided also in that substrate region, in addition to the VSS line and the VPP line.

In each word-line selecting circuit 16, the output node a of the VPP-based row decoder 13 is connected directly to the gate of the PMOSFET 23 and that of the NMOSFET 24, both included in the word-line driving circuit 11. Alternatively, the node a may be connected to the gates of the MOSFETs 23 and 24 by means of a plurality of VPP-based inverters. This connection scheme can be employed in other embodiments, which will be described below.

FIG. 7 shows a modified word-line selecting circuit in which the VPP-based row decoder 13 is not directly connected to the gate of the PMOSFET 23 incorporated in the word-line driving circuit 11, but connected thereto by two VPP-based inverters 18 (18-0, 18-1, . . . 18-n) and 19 (19-0, 18-1, . . . 18-n). These inverters 18 and 19 are provided for controlling the timing of controlling the PMOSFET 23.

It does not matter whether the row decoder 13 and the word-line driving circuit 11 are directly connected as shown in FIG. 4, or indirectly connected by inverters or the like as illustrated in FIG. 7. In either connection scheme, the PMOSFET 23 and the NMOSFET 24, both provided for driving the word line WL, can be controlled in accordance with the potential at the output node a of the VPP-based row decoder 13.

FIG. 8 shows a dynamic RAM according to a second embodiment of the present invention. To be more specific, FIG. 8 is a block diagram showing a VPP-generating circuit 14, a level-shifting circuit 15, word-line selecting circuits 16-0 to 16-n, and memory cells 10—all incorporated in this dynamic RAM.

In the dynamic RAM shown in FIG. 3, i.e., the first embodiment, the VPP-supplying circuits 12-0 to 12-n are used in the word-line selecting circuits 16-0 to 16-n, respectively. In the dynamic RAM shown in FIG. 8, i.e., the second embodiment, only one VPP-supplying circuit 12 is provided for supplying the boosted potential VPP to all word-line selecting circuits 16-0 to 16-n.

In the dynamic RAMs illustrated in FIGS. 3 and 8 (i.e., the first and second embodiments of the present invention), one level-shifting circuit 15 shifts the level of the precharge control signal PRCH, thus generating the precharge signal PRCH'. Instead, a plurality of level-shifting circuits which perform exactly the same operation may be used to shift the level of one and the same control signal, in consideration of the parasitic capacitance of lines and the driving ability of each level-shifting circuit. For example, level-shifting circuits may be provided for memory-cell blocks, or for groups of memory-cell blocks, respectively. This design scheme can be applied to other embodiments which will be described below.

FIG. 9 shows a dynamic RAM according to a third embodiment of this present invention. More specifically, FIG. 9 is a block diagram illustrating level-shifting circuits 15-1 and 15-2, word-line selecting circuits 16A-0 to 16A-n and partial decoders 40a to 40d—all incorporated in this dynamic RAM.

The dynamic RAM shown in FIG. 9 is a partial-decode type one. A dynamic RAM of partial-decode type can be operated with a low voltage because a relatively small number of transistors are connected in series between the power-supply potentials. It is therefore considered suitable for use as a semiconductor memory having a large memory capacity.

The dynamic RAM according to the third embodiment differs from the dynamic RAMs shown in FIGS. 3 and 8 (i.e., the first and second embodiments) in that four partial decoders 40a to 40d are used in place of the VPP-supplying circuits 12-0 to 12-n (FIG. 3) or the single VPP-supplying circuit 12 (FIG. 8). The decoders 40a to 40d perform a function called "partial decoding" or "pre-decoding."

The partial decoders 40a to 40d are connected to receive a VPP-level signal which the second level-shifting circuit 15-2 has generated by level-shifting a second control signal at the VCC level. The partial decoders 40a to 40d generate word-line driving signals WDRV1 to WDRV4 from the VPP-level signal. The driving signals WDRV1 to WDRV4, each at the VCC level, are supplied to each word-line selecting circuit 16A. Each word-line selecting circuit 16A differs a little from its counterpart 16 incorporated in the dynamic RAMs shown in FIGS. 3 and 8. More precisely, it has four word-line driving circuit 11a to 11d which are connected to the partial decoders 40a to 40d in order to receive the driving signals WDRV1 to WDRV4, respectively.

The word-line driving circuit 11a includes a PMOSFET 23a which has its gate connected to the output node a of a main row decoder 13, its source connected to the output node b of the partial decoder 40a, and its drain connected to the word line WL1. Similarly, the word-line driving circuit 11b includes a PMOSFET 23b which has its gate connected to the output node a of a main row decoder 13, its source connected to the output node b of the partial decoder 40b, and its drain connected to the word line WL2. The word-line driving circuit 11c includes a PMOSFET 23c which has its gate connected to the output node a of a main row decoder 13, its source connected to the output node b of the partial decoder 40c, and its drain connected to the word line WL3. The word-line driving circuit 11d incorporates a PMOSFET 23d which has its gate connected to the output node a of a main row decoder 13, its source connected to the output node b of the partial decoder 40d, and its drain connected to the word line WL4.

As indicated above, the dynamic RAM has a plurality of word-line selecting circuits 16A-0 to 16A-n, as does any dynamic RAM of partial-decode type. Each word-line selecting circuit 16A includes one main row decoder 13. Thus, the dynamic RAM has main row decoders 13-0 to 13-n in all. Supplied to each main row decoder 13 are a VPP-level control signal which the first level-shifting circuit 15-1 has generated by level-shifting a first control signal at the VCC level, as in the dynamic RAMs according to the first and second embodiment.

In a conventional semiconductor memory of partial-decode type, each word-line selecting circuit and each partial decoder need to have one level-shifting circuit each. The conventional memory inevitably comprises a relatively large number of circuits. This means that the conventional memory has a very large number of transistors. By contrast, the dynamic RAM according to the third embodiment of the invention needs only two level-shifting circuits, i.e., the first level-shifting circuit 15-1 which generates the VPP-level signal for controlling the main row decoders 13-0 to 13-n, and the second level-shifting circuit 15-2 which generates the VPP-level signal for controlling the partial decoders 40a to 40d. The the dynamic RAM shown in FIG. 9 has less circuits than the conventional semiconductor memory. Hence, it has far less transistors, and can have a small chip size and a high integration density, as do the dynamic RAMs according to the first and second embodiments. The use of only two level-shifting circuits results in a reduction of power consumed to generate boosted potential VPP.

The third embodiment is also advantageous in that the word lines WL1 to WLm are selected at higher speed than in a conventional semiconductor memory.

Each word-line selecting circuit incorporated in the conventional memory has a boot-strap circuit comprised a word-line driving NMOSFET and an isolation MOSFET. The isolation MOSFET is used to suppress a reverse flow of carries from the gate of the word-line driving NMOSFET. The output of a partial decoder is supplied to the source of the NMOSFET to couple the gate and source of the NMOS- FET. To prevent the threshold voltage of the NMOSFET from decreasing, the output of the partial decoder must be supplied after the main row decoder has generated a output and the gate of the NMOSFET has thereby been charged sufficiently. It is necessary to delay the outputting of a word-line driving signal WDRV to the NMOSFET. As a consequence, the word lines are selected but at low speed.

In the dynamic RAM shown in FIG. 9, PMOSFETs are used as word-line driving transistors. The threshold voltage of each PMOSFET hardly decreases. It is not necessary to supply a precharge signal PRCH2' to the partial decoders 40a to 40d after lapse of a predetermined time from the supplying of a precharge signal PRCH1' to the main row decoder 13. Rather, the signal PRCH2' can be supplied to the partial decoders 40a to 40d at the same time the signal PRCH1' is supplied to the main row decoder 13. Hence, the word lines WL1 to WLm can be selected at higher speed than in a conventional semiconductor memory.

Figure 10:
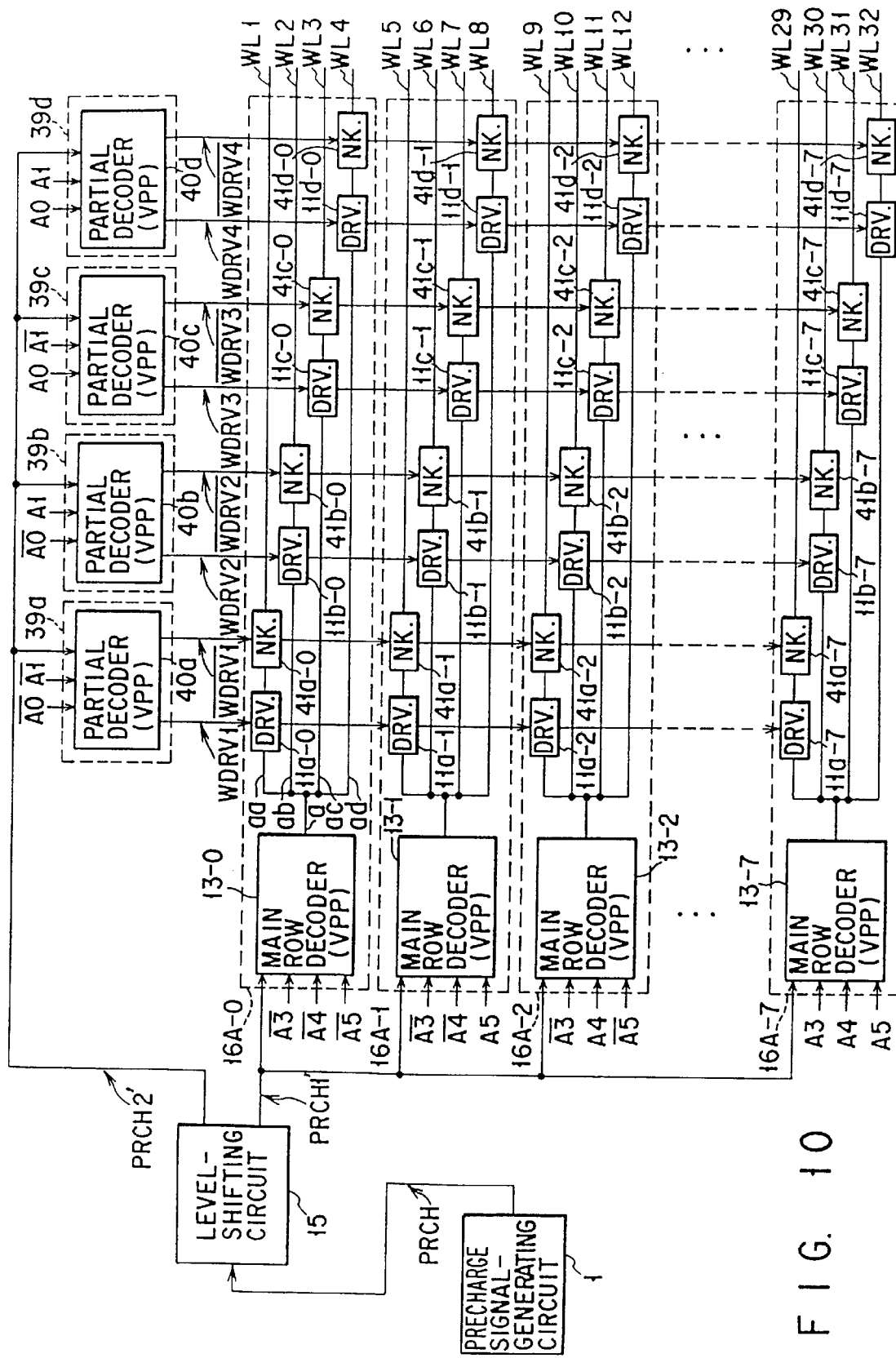
FIG. 10 is a block diagram showing a dynamic RAM according to a fourth embodiment of the present invention.

FIG. 10 shows a dynamic RAM according to a fourth embodiment of the invention, which is similar to the dynamic RAM according to the third embodiment.

As can be understood from the block diagram of FIG. 10, a precharge signal generating circuit 1 generates a VCC-level precharge signal PRCH which is used to precharge and discharge main row decoders 13-0 to 13-7 and partial decoders 40a to 40d. The precharge signal PRCH is supplied to a level-shifting circuit 15. The circuit 15 shifts the level of the precharge signal PRCH, generating a first precharge signal PRCH1' and a second precharge signal PRCH2' which are at VPP level. The first precharge signal PRCH1' is input directly to the main row decoders 13-0 to 13-7, and the second precharge signal PRCH2' to the partial decoders 40a to 40d. Instead, the signal PRCH1' may be supplied to the main row decoders via a buffer circuit including an inverter, and the signal PRCH2' may be supplied to the partial decoders through a buffer circuit including an inverter. This method of supplying the precharge signals may be employed in the case where the signals PRCH1' and PRCH2' must be input to the main row decoders and the partial decoders at different times, or the signals PRCH1' and PRCH2' must have different current drivabilities.

As shown in FIG. 10, the dynamic RAM has eight word-line selecting circuits 16A-0 to 16A-7 and four drive-signal line selecting circuits 39a to 39d. Each word-line selecting circuit 16A has one main row decoder 13, and each drive-signal line selecting circuit 39 has one partial decoder 40. It follows that the dynamic RAM has eight main row decoders 13-0 to 13-7 and four partial decoders 40a to 40d.

The first precharge signal PRCH1', which has been generated by level-shifting the precharge signal PRCH, is supplied to the main row decoders 13-0 to 13-7. Three of six row-address signals A3, A4, A5, /A3, /A4 and /A5 are input to each main row decoder 13. Eight combinations of row-address signals, each consisting of three signals, are therefore supplied to the main row decoders 13-0 to 13-7, respectively.

Each of the word-line selecting circuits 16A-0 to 16A-7 comprises a main row decoder 13, an output line a, four partial output lines aa to ad, four word-driving circuits 11a to 11d, and four word-line noise killer circuits 41a to 41d. The output line a is connected at one end to the main row decoder 13 and at the other end to the partial output lines aa to ad. The partial output lines aa to ad are connected to the word-line driving circuits 11a to 11d. The circuits 11a to 11d are coupled to the noise killer circuits 41a to 41d, which in turn are are connected to four word lines WL.

The second precharge signal PRCH2', which has been generated by level-shifting the precharge signal PRCH, is supplied to the partial decoders 40a to 40d which are incorporated in the drive-signal line selecting circuits 39a to 39d. Two of four row-address signals A0, A1, /A0 and /A1 are input to each main row decoder 13. Thus, four combinations of row-address signals, each consisting of two signals, are supplied to the partial decoders 40a to 40d, respectively.

In the fourth embodiment (FIG. 10), four different row-address signals are available which can be input to the partial decoders 40a to 40d. Alternatively, six different row-address signals may be used. If this is the case, there will be eight combinations of row-address signals, and eight partial output lines, instead of four, will be provided in each word-line selecting circuit 16A.

A pair of lines are connected to the drive-signal line selecting circuit 39a, for supplying word-line driving signals WDRV1 and /WDRV1. The word-line driving circuits 11a-0 to 11a-7 are arranged at the intersections of the line for supplying the word-line driving signal WDRV1 and the partial output lines aa of the word-line selecting circuits 16A-0 to 16A-7. As clearly shown in FIG. 10, the other word-line driving circuits 11b-0 to 11b-7, 11c-0 to 11c-7, 11d-0 to 11d-7 are arranged in a similar fashion. The word-line noise killer circuits 41a-0 to 41a-7 are arranged at the intersections of the line for supplying the word-line driving signal /WDRV1 and the partial output lines aa of the word-line selecting circuits 16A-0 to 16A-7. As shown in FIG. 10, the other word-line noise killer circuits 41b-0 to 41b-7, 41c-0 to 41c-7, 41d-0 to 41d-7 are arranged in a similar manner.

The word-line selecting circuits 16A-0 to 16A-7 are identical in terms of structure. The word-line selecting circuit 16A-0 will be described in detail, with reference to FIG. 11.

Figure 11:
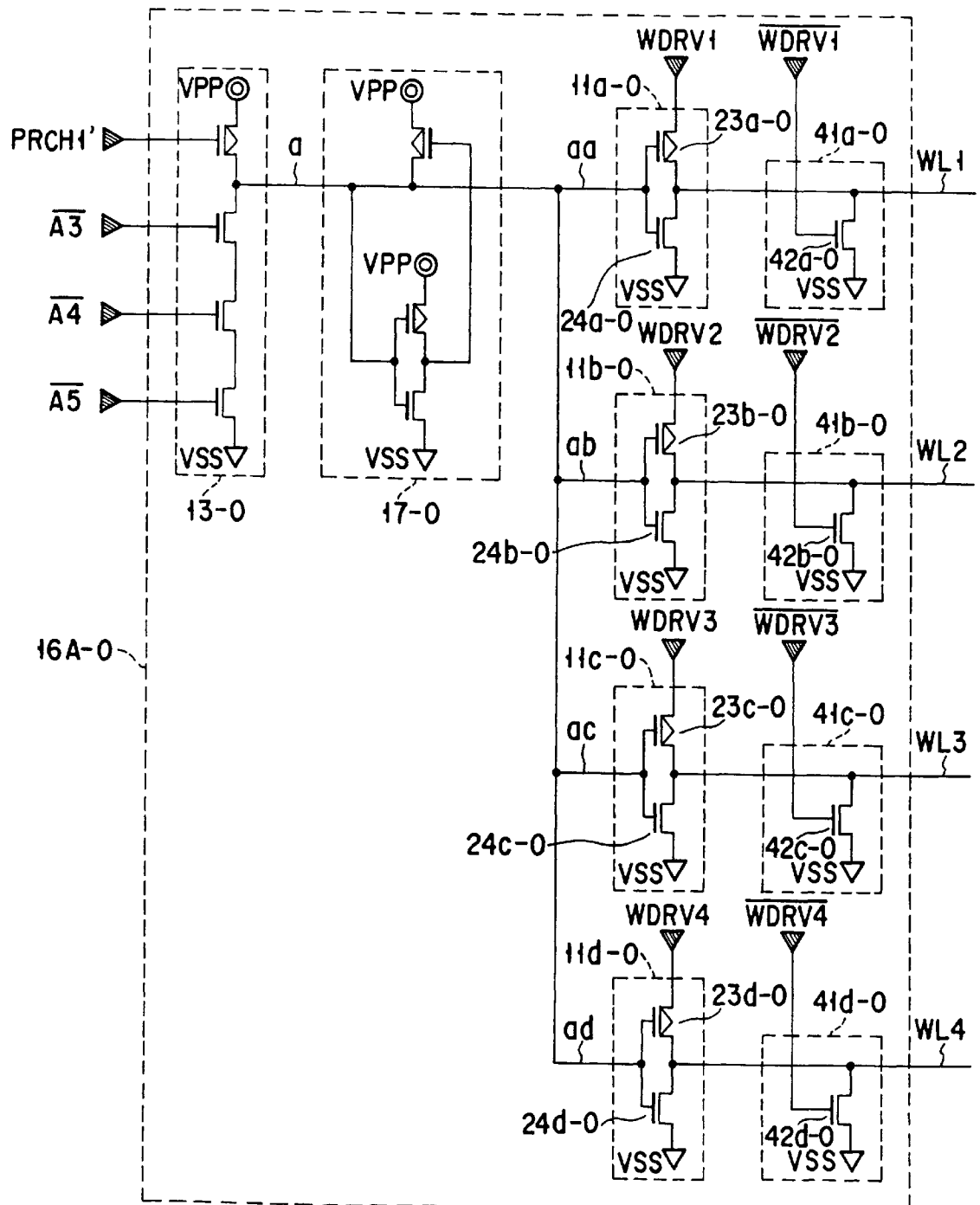
FIG. 11 is a circuit diagram of one of the identical word-line selecting circuits used in the dynamic RAM of FIG. 10.

As FIG. 11 shows, the word-line selecting circuit 16A-0 is similar to those incorporated in the first embodiment and illustrated in FIG. 4. It differs in that the output line a is connected to four partial output lines aa, ab, ac and ad. The word-line driving circuits 11a-0 to 11d-0 have almost the same structure as those shown in FIG. 4, but word-line driving signals WDRV1 to WDRV4 are supplied to the sources of PMOSFETs 23a-0 to 23d-0, respectively. The signals WDRV1 to WDRV4, which are at the VPP level, energize the word-line driving circuits 11a-0 to 11d-0. The outputs of the word-line driving circuits 11a-0 to 11d-0 are connected to the word lines WL1 to WL4. Connected to the word lines WL1 to WL4 are the word-line noise killer circuits 41a-0 to 41d-0. The word-line noise killer circuits include NMOSFETs 42a-0 to 42d-0, respectively. These NMOSFETs have their drains connected to the word lines WL1 to WL4. Inverted word-line driving signals /WDRV1 to /WDRV4 are input to the gates of the NMOSFETs 42a-0 to 42d-0. Each of these NMOSFETs is turned on when the input signal /WDRV is at the high level, setting the potential of the word line WL at the VSS level.

Assume that the word-line noise killer circuits 41a-0 to 41d-0 are not provided. Even so, the potential of the word WL can remain at the low level when the output of the main row decoder 13-0 and the word-line driving signal WDRV are at the low level. In practice, however, the potential of the word WL inevitably varies due to noise or the like, between 0v and a threshold voltage Vth. It is quite possible that each word-line driving circuit makes errors.

As indicated above, the NMOSFET incorporated in each word-line noise killer circuit is turned on when the inverted word-line driving signal /WDRV is at the high level—that is when the word-line driving signal WDRV is at the low level. The potential of the word line WL is thereby fixed at the VSS level. This suppresses variation of the potential at the word line WL, despite noise or the like. In the present embodiment, the inverted word-line driving signals /WDRV1 to /WDRV4 are set at the VCC level. Nonetheless, the signals /WDRV1 to /WDRV4 may be set at the VPP level as the word-line driving signals WDRV1 to WDRV4.

The drive-signal line selecting circuits 39a to 39d are identical in structure. The drive-signal line selecting circuit 39a will be described in detail, with reference to FIG. 12.

Figure 12:
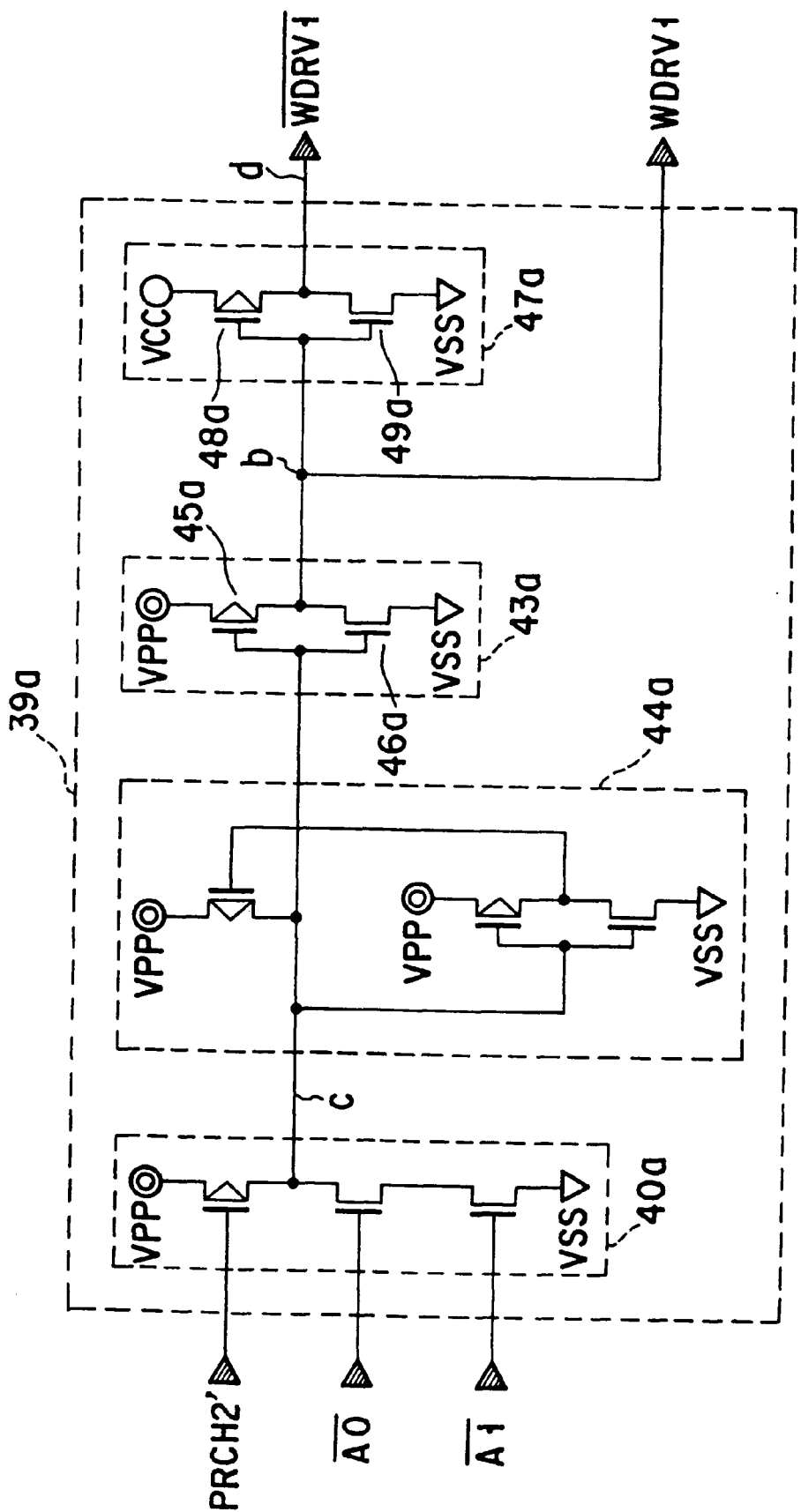
FIG. 12 is a circuit diagram of the word-line drive-signal selecting circuit shown in FIG. 10.

As FIG. 12 shows, the drive-signal line selecting circuit 39a incorporates the partial decoder 40a. The partial decoder 40a is similar to the main row decoder 13-0 (FIG. 11) in structure. The output line c of the partial decoder 40a is connected to a drive-signal line driving circuit 43a. Connected to the output line c is a noise killer circuit 44a which is similar in structure to the noise killer circuit 17-0 illustrated in FIG. 4.

The drive-signal line driving circuit 43a has a PMOSFET 45a and an NMOSFET 46a. The PMOSFET 45a has its source connected to a boosted potential VPP, its drain coupled to an output line b and its gate connected to the output line c. The NMOSFET 46a has its source connected to a low potential VSS, its drain connected to the output line b and its gate coupled to the output line c. The circuit 43a generates the word-line driving signal WDRV1, which is output through the output line b.

Connected to the output line b is a killer-driving circuit 47a which is designed to drive the word-line noise killer circuit 41a-0. The killer-driving circuit 47a includes an inverter which inverts the word-line driving signal WDRV1, thereby producing the word-line driving signal /WDRV1. The inverter comprises a PMOSFET 48a and an NMOSFET 49a. The PMOSFET 48a has its source coupled to a high potential VCC, its drain connected to an output line d and its gate connected to the output line b. The NMOSFET 49a has its source connected to the low potential VSS, its drain coupled to the output line d and its gate coupled to the output line b. The killer-driving circuit 47a generates the word-line driving signal /WDRV1, which is output through the output line d.

The inverter incorporated in the killer-driving circuit 47a utilizes the high potential VCC as input power. Therefore, power consumed to generate boosted potential VPP can be reduced. The inverter may be replaced by an inverter which uses the boosted potential VPP as input power. In this case, the potential of the word line WL can be quickly changed to the VSS level, whereby the word line WL is driven at high speed, and the line for applying the high potential VCC can be omitted.

For a memory having a large storage capacity it is desirable to minimize the power consumed to generate boosted potential VPP. The smaller the power used to generate boosted potential VPP, the less the VPP fluctuation, and the smaller a potential-boosted capacitor.

The drive-signal line selecting circuits 39a to 39d may be of the same structure as the modified word-line selecting circuit which is illustrated in FIG. 7.

The dynamic RAM according to the fourth embodiment needs to have one level-shifting circuit only. The level-shifting circuit 15 shifts the level of the precharge signal PRCH and generates two precharge signals PRCH1' and PRCH2'. The signal PRCH1' is input to the main row decoders 13-0 to 13-7, and the signal PRCH2' to the partial decoders 40a to 40d. Having only one level-shifting circuit, the dynamic RAM comprises less circuits and, hence, far less transistors than the conventional semiconductor memory.

Furthermore, since only one level-shifting circuit is used, power required to generate boosted potential VPP can be reduced more than in the third embodiment (FIG. 9) which has two level-shifting circuits, i.e., the circuit 15-1 for generating a VPP-level signal to control the main row decoders 13-0 to 13-n and the circuit 15-2 for generating a VPP-level signal to control the partial decoders 40a to 40d.

As indicated above, the inverted word-line driving signal /WDRV1 is generated by an inverter which uses the high potential VCC as power. This also helps to decrease power consumed to generate boosted potential VPP.

The chip layout of the dynamic RAM according to the fourth embodiment will be described. The components of the dynamic RAM are arranged in a novel and useful pattern which increases the integration density, facilitates the manufacture and suppresses noise interference.

Figure 13:
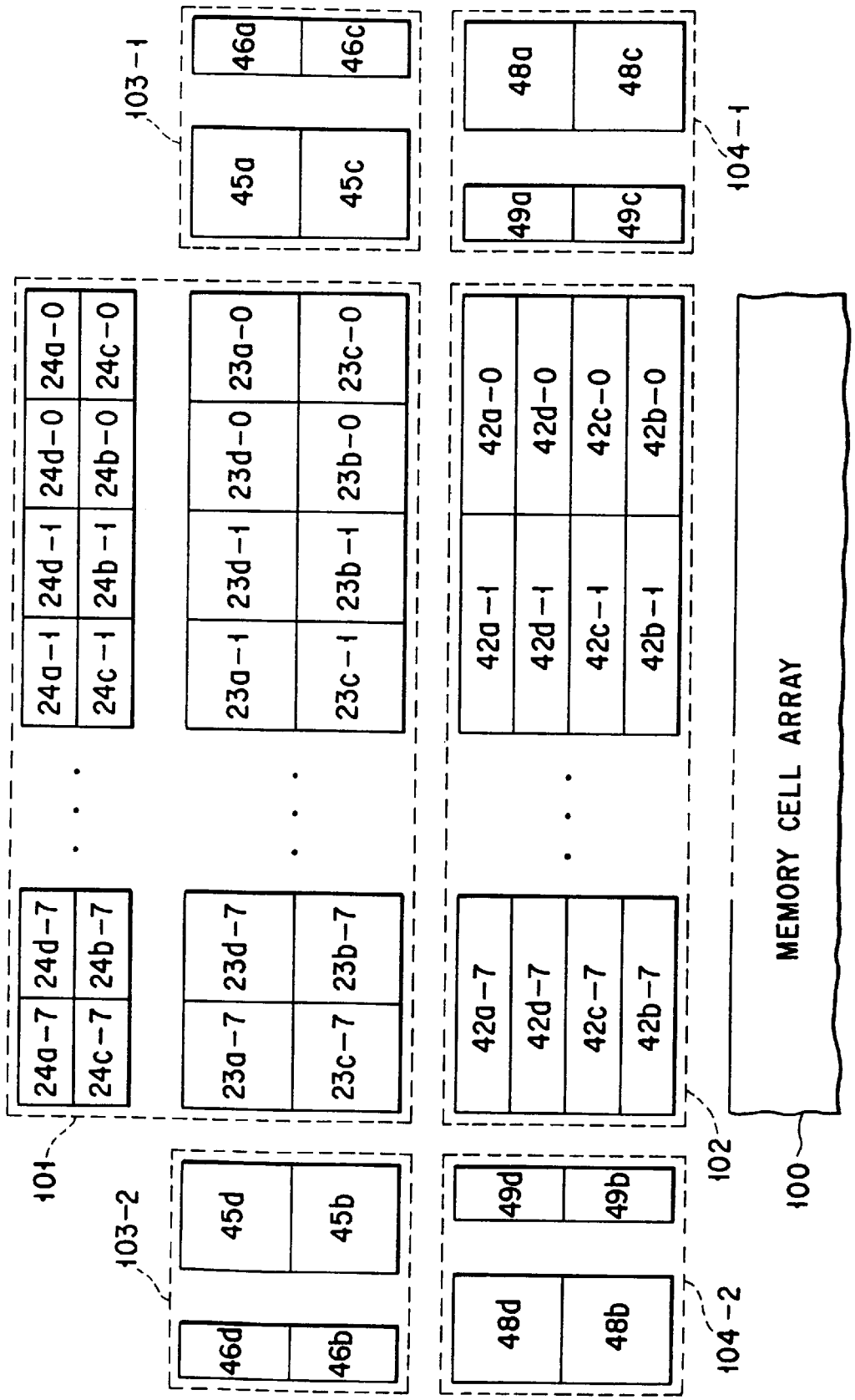
FIG. 13 is a diagram illustrating the chip layout of the dynamic RAM shown in FIG. 10.

FIG. 13 is a diagram illustrating the chip layout of the dynamic RAM. As FIG. 13 shows, the RAM has an array 100 of memory cells, an array 101 of word-line driving circuits, an array 102 of word-line noise killer circuits, an array 103 of drive-signal line driving circuits, and an array 104 of killer-driving circuits.

The array 100 comprises memory cells arranged in rows and columns.

The array 101 includes the PMOSFETs 23a-0 to 23a-7, 23b-0 to 23b-7, 23c-0 to 23c-7 and 23d-0 to 23d-7, and the NMOSFETs 24a-0 to 24a-7, 24b-0 to 24b-8, 24c-0 to 24c-7 and 24d-0 to 24d-7, which are incorporated in the word-line driving circuits and which are arranged in a prescribed pattern.

The array 102 of word-line noise killer circuits is arranged between the array 100 of memory cells and the array 101 of word-line driving circuits. The array 102 includes the NMOSFETs 42a-0 to 42a-7, 42b-0 to 42b-7, 42c-0 to 42c-7 and 42d-0 to 42d-7, which are used in the word-line noise killer circuits and which are arranged in a specific pattern.

The array 103 of drive-signal line driving circuits is located adjacent to the array 101 of word-line driving circuits. More precisely, the array 103 consists of two sub-arrays 103-1 and 103-2, which are positioned on two opposite sides of the array 101, respectively. The first sub-array 103-1 includes the PMOSFETs 45a and 45c and the NMOSFETs 46a and 46c which are used in the drive-signal line driving circuit. The second sub-array 103-2 includes the PMOSFETs 45b and 45d and the NMOSFETs 46b and 46d which are included in the drive-signal line driving circuit.

The array 104 of killer-driving circuits is provided adjacent to the 102 of word-line noise killer circuits. To be more specific, the array 104 consists of two sub-arrays 104-1 and 104-2, which are positioned on two opposite sides of the array 102, respectively. The first sub-array 104-1 includes the PMOSFETs 48a and 48c and the NMOSFETs 49a and 49c which are incorporated in the killer-driving circuit. The second sub-array 104-2 includes the PMOSFETs 48b and 48d and the NMOSFETs 49b and 49d which are used in the killer-driving circuit.

Figure 15A:
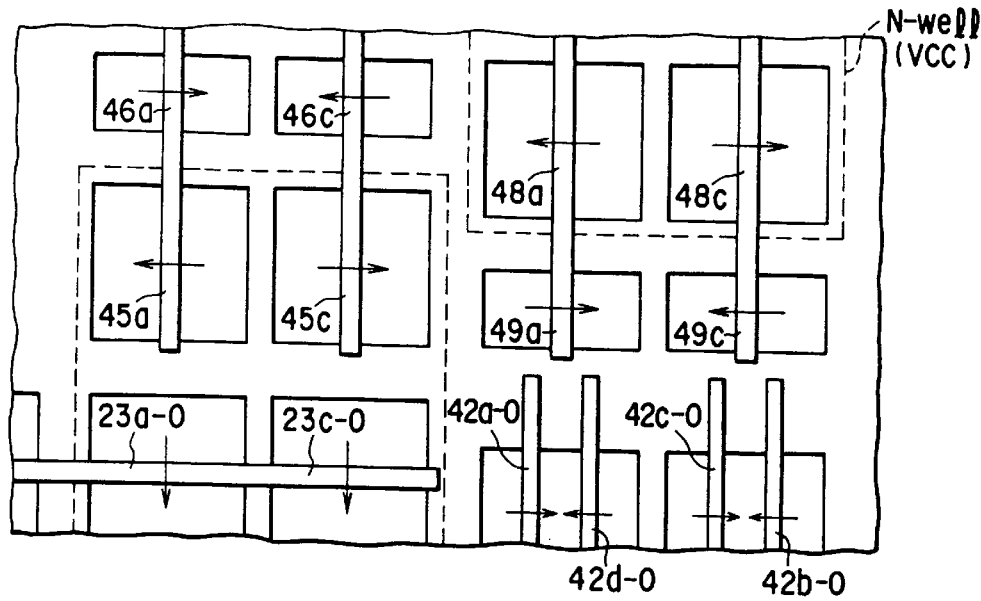
FIG. 15A is a diagram showing the array of the word-line drive-signal circuits and the array of the killer driving circuits.

FIG. 14 is a diagram showing, in detail, the array 101 of word-line driving circuits and the 102 of word-line noise killer circuits. FIG. 15A is a diagram illustrating, in detail, the first sub-array 103-1 of drive-signal line driving circuits and the first sub-array 104-1 of killer-driving circuits. FIG. 15A is a diagram depicting, in detail, the second sub-array 103-2 of drive-signal line diving circuits and the second sub-array 104-2 of killer-driving circuits.

The arrays 101 and 102 will be described in detail, with reference to FIG. 14. As shown in FIG. 14, the NMOSFETs 42a-0 to 42a-7, 42b-0 to 42b-7, 42c-0 to 42c-7 and 42d-0 to 42d-7 used in the word-line noise killer circuits are oriented at 90° with respect to the PMOSFETs 23a-0 to 23a-7, 23b-0 to 23b-7, 23c-0 to 23c-7 and 23d-0 to 23d-7 and the NMOSFETs 24a-0 to 24a-7, 24b-0 to 24b-7, 24c-0 t 24c-7 and 24d-0 to 24-7 which are incorporated in the word-line driving circuits. Each arrow shown in FIG. 14 indicates the direction in which a current flows through the corresponding MOSFET, and in which the gate of the MOSFET extends.

Figure 15B:
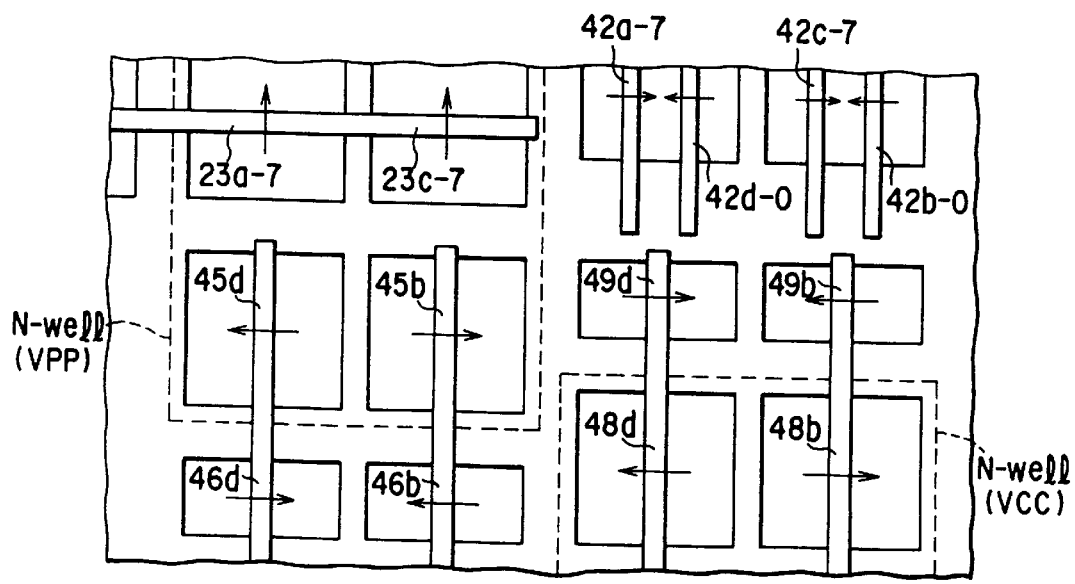
FIG. 15B is a diagram showing the array of the word-line drive-signal circuits and the array of the killer driving circuit.

The sub-arrays 103-1, 103-2, 104-1 and 104-2 will be described in detail with reference to FIGS. 15A and 15B. As shown in FIGS. 15A and 15B, the PMOSFETs 45a to 45d and the NMOSFETs 46a to 46d, which are used in the drive-signal line driving circuits, are oriented in the same direction as the NMOSFETs 42a-0 to 42a-7, 42b-0 to 42b-7, 42c-0 to 42c-7 and 42d-0 to 42d-7 included in the word-line noise killer circuits. Similarly, the PMOSFETs 48a to 48d and the NMOSFETs 49a to 49d, which are used in the killer-driving circuits, are oriented in the same direction as the NMOSFETs 42a-0 to 42a-7, 42b-0 to 42b-7, 42c-0 to 42c-7 and 42d-0 to 42d-7 which are included in the word-line noise killer circuits. Each arrow shown in FIGS. 15A and 15B indicates, as those in FIG. 14, the direction in which a current flows through the corresponding MOSFET, and in which the gate of the MOSFET extends.

As described above and shown in FIG. 13, the array 102 of word-line noise killer circuits is arranged between the array 100 of memory cells and the array 101 of word-line driving circuits. Thus, the array 101 of word-line driving circuits is spaced far away from the array 100 of memory cells. The noise interference between the arrays 100 and 101 is suppressed, decreasing the possibility that the dynamic RAM make errors while operating.

As mentioned above and evident from FIGS. 14, 15A and 15B, the NMOSFETs included in the word-line noise killer circuits are oriented at 90° with respect to the PMOSFETs and NMOSFETs which are included in the word-line driving circuits. This prevents an increase in the substrate-surface area occupied by the word-line noise killer circuits. In other words, the dynamic RAM according to the fourth embodiment of the invention can have a high integration density.

Figure 16:
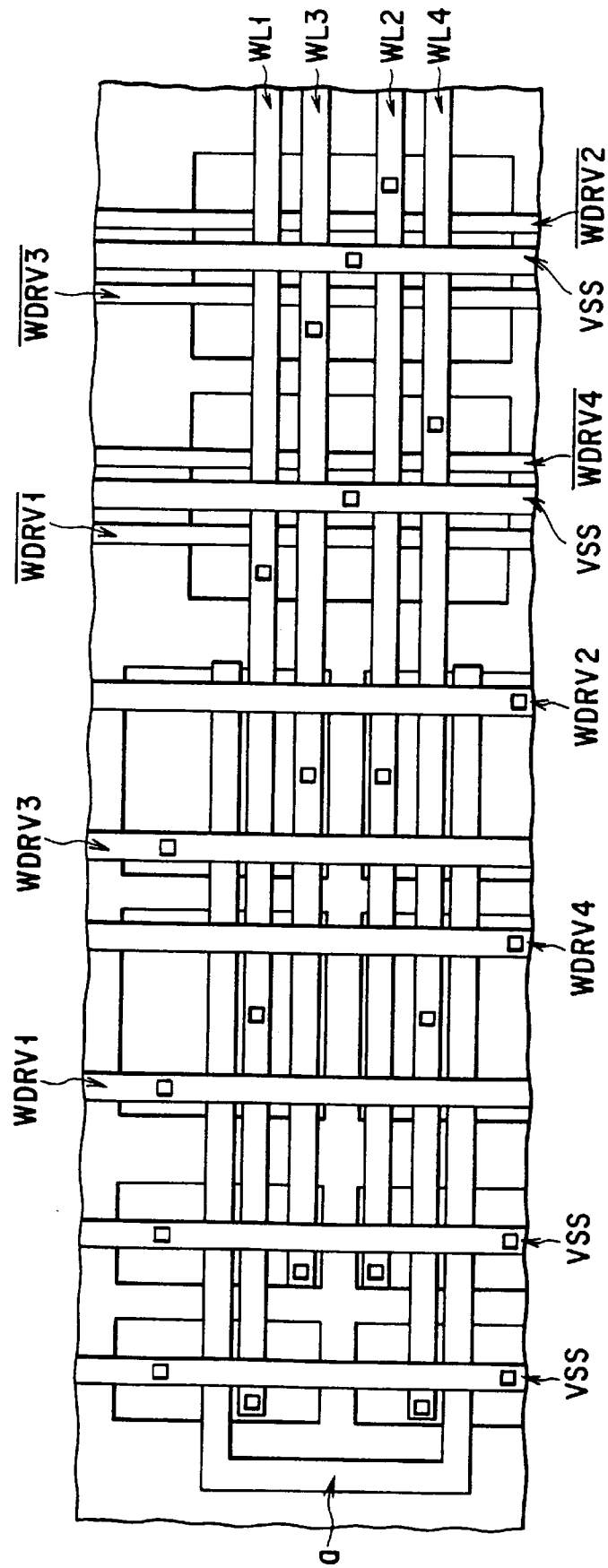
FIG. 16 is a wiring-pattern diagram of a part of the dynamic RAM shown in FIG. 10.

With the chip layout of FIG. 13 it is possible to arrange the word lines over the array 102 of word-line noise killer circuits—extending from the word-line driving circuits to the array 100 of memory cells as is illustrated in FIG. 16. That is, the word lines can extend straight. Straight word lines, though very thin, can be formed more easily than word lines which are equally thin and bent at several portions.

Figure 17:
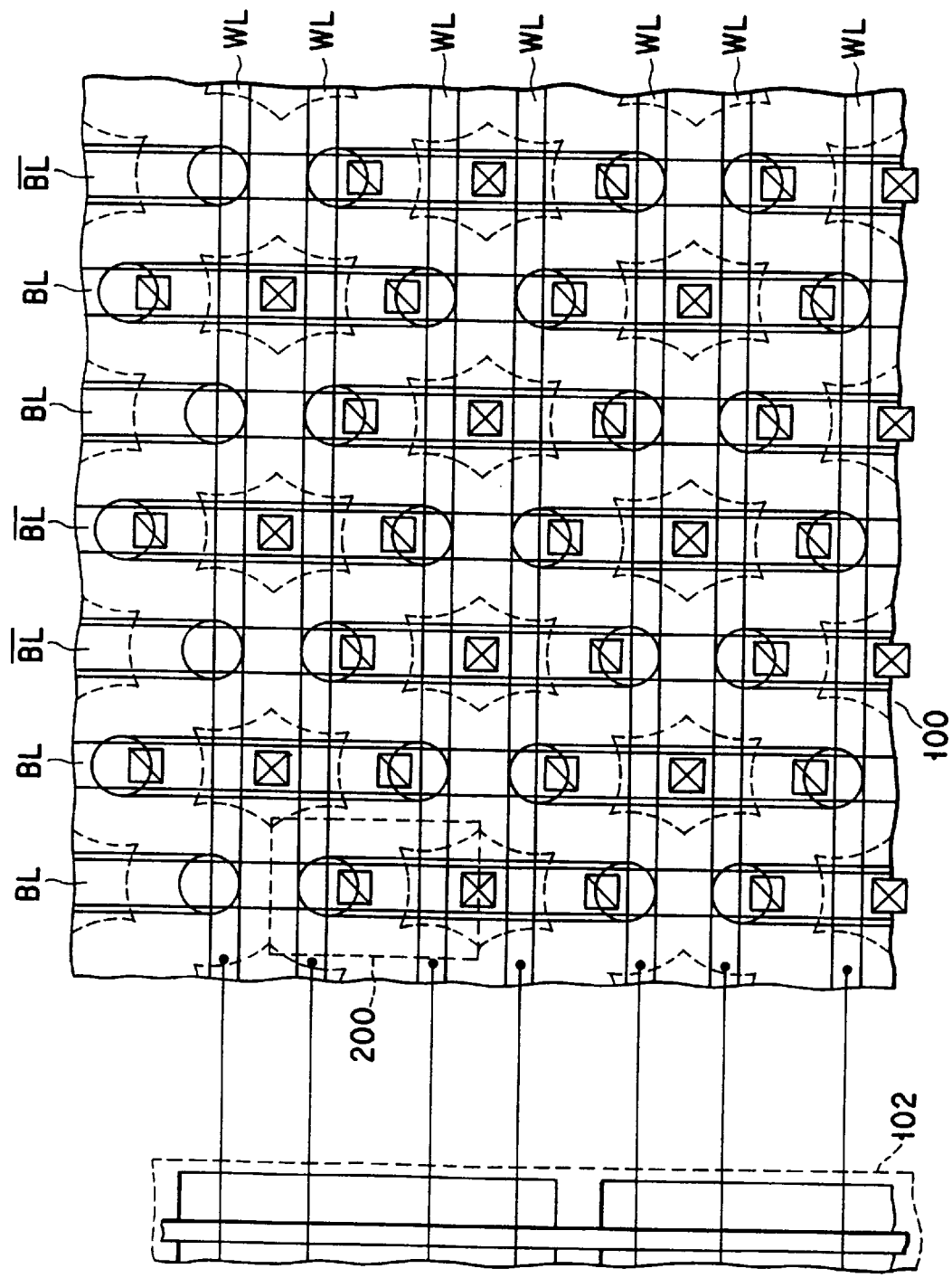
FIG. 17 is a plan view of the memory cell array incorporated in the dynamic RAM of FIG. 10, showing the wiring-pattern of the memory cell array.

FIG. 17 is a plan view of the array 100 of memory cells, incorporated in the dynamic RAM (FIG. 10). As show n in FIG. 17, the array 100 comprises memory cells 200, each including one transfer transistor and one capacitor. The transfer transistors of the cells 200 are oriented at 90° to the NMOSFETs incorporated in the word-line noise killer circuits. The memory cells 200 are buried-plate trench (BPT) cells which can be formed in a high density.

Figure 18:
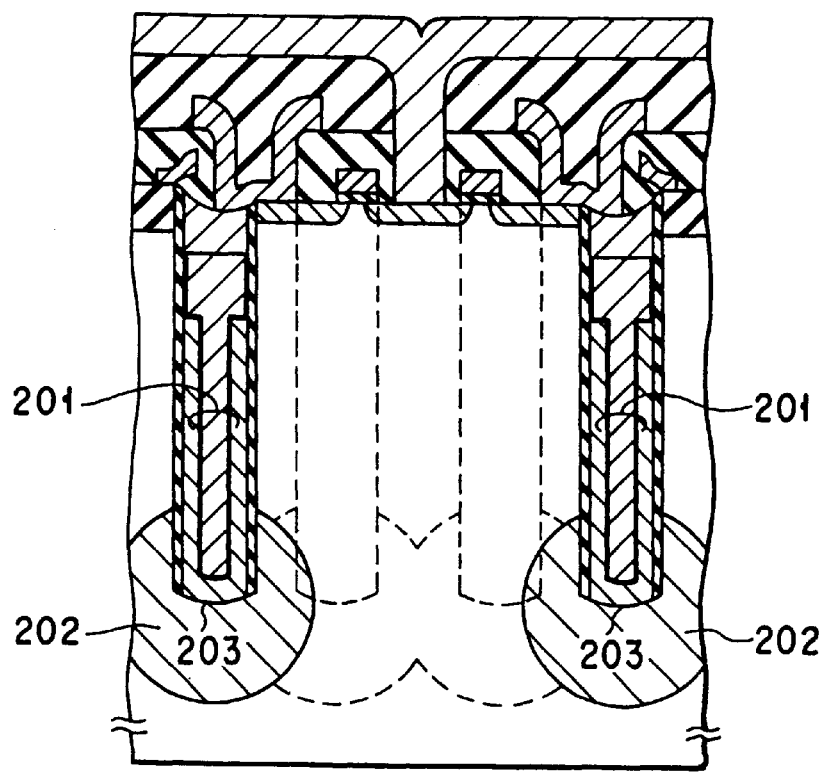
FIG. 18 is a sectional view of a part of the memory cell array, showing two adjacent BPT cells included in the memory cell array.

FIG. 18 is a sectional view showing adjacent two of the BPT cells 200. As can be understood from FIG. 18, a plate potential VPL is applied to the capacitor 201 of each BPT cell 200 from an N-type silicon layer 202 provided within the P-type silicon substrate. The layer 202 has been formed by diffusing an N-type impurity from the bottom of a trench 203 made in the substrate. The layer 202 is buried in the substrate and is thus known also as "buried wiring layer."

The chip layout of FIG. 13 comes to have an advantage after the BPT cells 200 are formed in the memory cell region. This advantage will be explained with reference to FIG. 19 which is a sectional view of the substrate, illustrating the array 101 of word-line driving circuits, the array 102 of word-line noise killer circuits and the array 100 of memory cells.

Figure 19:
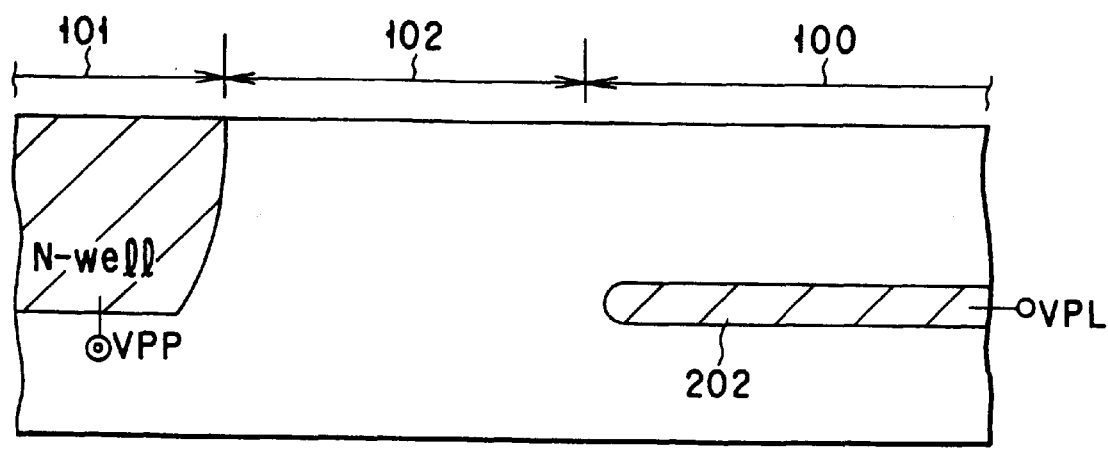
FIG. 19 is a sectional view of the substrate of the dynamic RAM shown in FIG. 10, illustrating the array of word-line driving circuits, the array of word-line noise killer circuits and the memory cell array.

As shown in FIG. 19, each BPT cell 200 has an N-type buried wiring layer 202. The plate potential VPL is applied to the buried wiring layer 202. (Usually, the potential VPL is about half the power-supply potential VCC.) The array 101 of word-line driving circuits has an N-type well in which PMOSFETs are formed. It is to the N-type well that the boosted potential VPP is applied. Were the N-type well located close to the N-type buried wiring layer 202, the potential of the layer 202 would fluctuate due to the potential of the N-type well. As shown in FIG. 19, the array 102 of word-line noise killer circuits is provided between the array 100 of memory cells and the array 101 of the word-line driving circuits. The array 102 isolates the N-type well from the N-type buried wiring layer 202. The fluctuation in the potential of the layer 202 is therefore suppressed.

FIG. 20 is a diagram showing the chip layout of the memory block of the dynamic RAM according to the fourth embodiment of the invention. As illustrated in FIG. 20, the array 105 of main row decoders is provided adjacent to the array 101 of word-line driving circuits. The array 106 of partial decoders consists of two sub-arrays 106-1 and 106-2. The first sub-array 106-1 is positioned close to the first sub-array 103-1 of drive-signal line driving circuits, and the second sub-array 106-2 adjacent to the second sub-array 103-2 of drive-signal line driving circuits. The region 107 of the level-shifting circuit 15 (FIG. 10) is arranged near the array 105 of main row decoders. The region capacitor 108 is located adjacent to the region 109 of VPP-generating circuits.

In the chip layout shown in FIG. 20, the array 105 of main row decoders, the second sub-array 106-2 of partial decoders, the array 101 of word-line driving circuits, and the array 102 of word-line noise killer circuits are arranged between the array 100 of memory cells and the region 107 of the level-shifting circuit 15. Therefore, the noise interference between the level-shifting circuit 15 and the array 100 of memory cells can be suppressed. Further, since the region 107 of the level-shifting circuit 15 is provided near the array 105 of main row decoders, the distance between the circuit 15 and the main row decoders is short, and the lines connecting the circuit 15 to the main row decoders are short. The precharge signal PRCH1' can therefore be supplied from the level-shifting circuit 15 to the main row decoders 13-0 to 13-7 without any noticeable delay. Still further, since both sub-arrays 106-1 and 106-2 of partial decoders are located close to the array 105 of main row decoders, the distance between the level-shifting circuit 15 and the partial decoders 40a to 40d is short, too.

In practice, a plurality of identical memory blocks of the type shown in FIG. 20 are integrated in a single semiconductor chip, thus constituting a memory of a great storage capacity. Each of the memory blocks incorporates one capacitor region 108 and one region 109 of voltage-raising circuits. As a result, in each memory block there can be generated a boosted potential VPP which scarcely varies. It should be noted that a variation of the potential VPP is a cause of malfunction of the dynamic RAM.

FIG. 21 is a circuit diagram illustrating a dynamic RAM according to a fifth embodiment of the present invention. Like the third and fourth embodiments, the fifth embodiment is a dynamic RAM of partial-decode type but differs in three respects. First, the row decoders are comprised of CMOS circuits. Second, no precharge signals are used. Third, no noise killer circuits are connected to the output lines of the row decoders.

As is illustrated in FIG. 21, each VPP-supplying circuit 51 includes a PMOSFET 23 and an NMOSFET 24. The PMOSFET 23 and the NMOSFET 24 are connected to one word line WL for driving the word line WL. The MOSFETs 23 and 24 have their gates connected to each other. The node of their gates is directly connected to the output line a of the VPP-based row decoder 50. Needless to say, the gate node may be connected to the output line aa by a VPP-based inverter, which delays the output signal of the decoder 50.

The row decoder 50 comprises a CMOS-NAND gate which is controlled by address signals A2 to A4. Each VPP-supplying circuit 51 further includes a partial decoder section comprised of a CMOS-NAND gate which is controlled by address signals A0 and A1. Both the row decoder 50 and the partial decoder section are driven by a boosted potential VPP. The address signals A0 to A4 control the PMOSFETs incorporated in the row decoder 50 and the VPP-supplying circuit 51. They must be VPP-based control signals so that the PMOSFETs may be turned off completely when the address signals are at high level. Each address signal is a VPP-based one which a level-shifting circuit (not shown) has generated by level-shifting a VCC-based control signal. Thus, at least five level-shifting circuits must be incorporated in the dynamic RAM shown in FIG. 21. If each level-shifting circuit has an inadequate drivability, one or more additional level-shifting circuits may be used to generate a VPP-based address signal.

Even if two or more level-shifting circuits are provided to generate each VPP-based address signal, the fifth embodiment requires but far less level-shifting circuits than the conventional semiconductor memories. Like the first to fourth embodiment, the fifth embodiment can have a low chip size and can operate at small power consumption and with high reliability, making virtually no errors.

Furthermore, the dynamic RAM according to the fifth embodiment is advantageous in that the word lines can be driven at high speed. This is because any decoder circuit used in the fifth embodiment is a CMOS circuit, not a circuit comprised of NMOSFETs. It is therefore unnecessary to input a precharge signal to charge the output of the decoder circuit before the address signals are input to the decoder circuit. In addition, the potential at the output line a of any decoder hardly change the fact that a noise killer circuit is not connected to the line a. This is because the output of the decoder is fixed at either the VPP level or the VSS level and would not assume a floating state.

The technique of level-shifting a precharge signal cannot be applied to the dynamic RAM according to the fifth embodiment. With the fifth embodiment, however, it is possible to drive noise killer driving circuits with the power-supply potential VCC thereby to reduce power required to generate boosted potential VPP. Moreover, it is also possible to arrange the array 102 of word-line noise killer circuits between the array 100 of memory cells and the array 101 of word-line driving circuits, so as to suppress the noise interference between the arrays 100 and 101 without jeopardizing the high integration density.

In the first to fifth embodiments described above, the row decoders are NAND gates. Nonetheless, NOR gates can be employed instead. FIG. 22 shows a word-line selecting circuit including a NOR gate 60 used as a row decoder. The NOR gate 60 comprises NMOSFETs. As shown in FIG. 22, the PMOSFET 61 included in a noise killer circuit is not directly connected to the output line a of the NOR gate 60. Rather, the PMOSFET 61 is connected to the output line a by a VPP-based inverter 62.

In the above description, the words "connected" and "coupled" mean either a direct connection or an indirect connection, unless followed by the phrase "directly to" or "indirectly to."

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells;
   a word line connected to the plurality of memory cells;
   a boosted voltage generating circuit which generates a constant boosted potential higher than a power-supply potential;
   a level-shifting circuit which level-shifts a precharge signal using the power-supply potential to a boosted precharge signal using the constant boosted potential;
   a decoder circuit having address signal input terminals to which address signals are inputted, a precharge signal input terminal to which the boosted precharge signal is inputted, and an output terminal, the decoder circuit outputting one of the constant boosted potential and a ground potential from the output terminal thereof in accordance with the address signals and the boosted precharge signal;
   a circuit having an inverter circuit, a P-channel transistor and an output terminal, the inverter circuit comprising an input terminal connected to the output terminal of the decoder circuit and an output terminal, the inverter circuit being supplied with the constant boosted potential and the ground potential, the P-channel transistor comprising a gate terminal connected to the output terminal of the inverter circuit and a current path, one end of the current path being supplied with the constant boosted potential and another end of the current path being connected to the output terminal of the decoder circuit; and
   a word line driving circuit which drives the word line in accordance with a potential at the output terminal of the circuit.

2. The semiconductor memory device according to claim 1, wherein the output terminal of the circuit is connected to the output terminal of the decoder circuit.

3. The semiconductor memory device according to claim 1, wherein the output terminal of the circuit is connected to the output terminal of the inverter circuit.

4. The semiconductor memory device according to claim 1, wherein said decoder circuit comprises:
   a precharging circuit having a current path supplied with the constant boosted potential, and transferring the constant boosted potential to the output terminal of the decoder circuit in accordance with the boosted precharge signal; and a decoding circuit having a current path supplied with the ground potential to the output terminal of the decoder circuit in accordance with the address signals.

5. The semiconductor memory device according to claim 4, wherein the precharging circuit comprises a P-channel transistor which transfers the constant boosted potential to the output terminal of the decoder circuit in accordance with the boosted precharge signal; and the decoding circuit comprises series-connected N-channel transistors which transfer the ground potential to the output terminal of the decoder circuit in accordance with the address signals.

6. A semiconductor memory device comprising:

a plurality of memory cells;

a word line connected to the plurality of memory cells;

a boosted voltage generating circuit which generates a constant boosted potential higher than a power-supply potential;

a level-shifting circuit which level-shifts a precharge signal using the power-supply potential to a boosted precharge signal using the constant boosted potential;

a decoder circuit having address signal input terminals to which address signals are inputted, a precharge signal input terminal to which the boosted precharge signal is inputted, and an output terminal, the decoder circuit outputting one of the constant boosted potential and a ground potential from the output terminal thereof in accordance with the address signals and the boosted precharge signal;

a circuit having an inverter circuit, a P-channel transistor and an output terminal, the inverter circuit comprising an input terminal connected to the output terminal of the decoder circuit and an output terminal, the inverter circuit being supplied with the constant boosted potential and the ground potential, the P-channel transistor comprising a gate terminal connected to the output terminal of the inverter circuit and a current path, one end of the current path being supplied with the constant boosted potential and another end of the current path being connected to the output terminal of the decoder circuit; and a word line driving circuit associated with the output terminal of the circuit and driving the word line.

7. The semiconductor memory device according to claim 6, wherein the output terminal of the circuit is connected to the output terminal of the decoder circuit.

8. The semiconductor memory device according to claim 6, wherein the output terminal of the circuit is connected to the output terminal of the inverter circuit.

9. The semiconductor memory device according to claim 6, wherein said decoder circuit comprises:

a precharging circuit having a current path supplied with the constant boosted potential, and transferring the constant boosted potential to the output terminal of the decoder circuit in accordance with the boosted precharge signal; and a decoding circuit having a current path supplied with the ground potential to the output terminal of the decoder circuit in accordance with the address signals.

10. The semiconductor memory device according to claim 9, wherein the precharging circuit comprises a P-channel transistor which transfers the constant boosted potential to the output terminal of the decoder circuit in accordance with the boosted precharge signal; and the decoding circuit comprises series-connected N-channel transistors which transfer the ground potential to the output terminal of the decoder circuit in accordance with the address signals.

11. A semiconductor memory device comprising:

a first word line connected to a plurality of memory cells;

a second word line connected to a plurality of memory cells;

a boosted voltage generating circuit which generates a constant boosted potential higher than a power-supply potential;

a level-shifting circuit which level-shifts a precharge signal using the power-supply potential to a boosted precharge signal using the constant boosted potential;

a first decoder circuit having address signal input terminals to which first address signals are inputted, a precharge signal input terminal to which the boosted precharge signal is inputted, and an output terminal, the first decoder circuit outputting one of the constant boosted potential and a ground potential from the output terminal thereof in accordance with the first address signals and the boosted precharge signal;

a second decoder circuit having address signal input terminals to which second address signals are inputted, a precharge signal input terminal to which the boosted precharge signal is inputted, and an output terminal, the second decoder circuit outputting one of the constant boosted potential and the ground potential from the output terminal thereof in accordance with the second address signals and the boosted precharge signal;

a first circuit having a first inverter circuit, a first P-channel transistor and an output terminal, the first inverter circuit comprising an input terminal connected to the output terminal of the first decoder circuit and an output terminal, the first inverter circuit being supplied with the constant boosted potential and the ground potential, the first P-channel transistor comprising a gate terminal connected to the output terminal of the first inverter circuit and a current path, one end of the current path being supplied with the constant boosted potential and another end of the current path being connected to the output terminal of the first decoder circuit;

a second circuit having a second inverter circuit, a second P-channel transistor and an output terminal, the second inverter circuit comprising an input terminal connected to the output terminal of the second decoder circuit and an output terminal, the second inverter circuit being supplied with the constant boosted potential and the ground potential, the second P-channel transistor comprising a gate terminal connected to the output terminal of the second inverter circuit and a current path, one end of the current path being supplied with the constant boosted potential and another end of the current path being connected to the output terminal of the second decoder circuit;

a first word line driving circuit which drives the first word line in accordance with a potential at the output terminal of the first circuit; and a second word line driving circuit which drives the second word line in accordance with a potential at the output terminal of the second circuit.

12. The semiconductor memory device according to claim 11, wherein the output terminal of the first circuit is connected to the output terminal of the first decoder circuit, and the output terminal of the second circuit is connected to the output terminal of the second decoder circuit.

13. The semiconductor memory device according to claim 11, wherein the output terminal of the first circuit is connected to the output terminal of the first inverter circuit, and the output terminal of the second circuit is connected to the output terminal of the second inverter circuit.

14. The semiconductor memory device according to claim 11, wherein said first decoder circuit comprises:

a first precharging circuit having a current path supplied with the constant boosted potential, and transferring the constant boosted potential to the output terminal of the first decoder circuit in accordance with the boosted precharge signal;

a first decoding circuit having a current path supplied with the ground potential to the output terminal of the first decoder circuit in accordance with the first address signals;

a second precharging circuit having a current path supplied with the constant boosted potential and transferring the constant boosted potential to the output terminal of the second decoder circuit in accordance with the boosted precharge signal; and a second decoding circuit having a current path supplied with the ground potential to the output terminal of the second decoder circuit in accordance with the second address signals.

15. The semiconductor memory device according to claim 14, wherein the first precharging circuit comprises a P-channel transistor which transfers the constant boosted potential to the output terminal of the first decoder circuit in accordance with the boosted precharge signal;

the first decoding circuit comprises series-connected N-channel transistors which transfer the ground potential to the output terminal of the first decoder circuit in accordance with the first address signals;

the second precharging circuit comprises a P-channel transistor which transfers the constant boosted potential to the output terminal of the second decoder circuit in accordance with the boosted precharge signal; and the second decoding circuit comprises series-connected N-channel transistors which transfer the ground potential to the output terminal of the second decoder circuit in accordance with the second address signals.

16. A semiconductor memory device comprising:

a first word line connected to a plurality of memory cells;

a second word line connected to a plurality of memory cells;

a boosted voltage generating circuit which generates a constant boosted potential higher than a power-supply potential;

a level-shifting circuit which level-shifts a precharge signal using the power-supply potential to a boosted precharge signal using the constant boosted potential;

a first decoder circuit having address signal input terminals to which first address signals are inputted, a precharge signal input terminal to which the boosted precharge signal is inputted, and an output terminal, the first decoder circuit outputting one of the constant boosted potential and a ground potential from the output terminal thereof in accordance with the first address signals and the boosted precharge signal;

a second decoder circuit having address signal input terminals to which second address signals are inputted, a precharge signal input terminal to which the boosted precharge signal is inputted, and an output terminal, the second decoder circuit outputting one of the constant boosted potential and the ground potential from the output terminal thereof in accordance with the second address signals and the boosted precharge signal;

a first circuit having a first inverter circuit, a first P-channel transistor and an output terminal, the first inverter circuit comprising an input terminal connected to the output terminal of the first decoder circuit and an output terminal, the first inverter circuit being supplied with the constant boosted potential and the ground potential, the first P-channel transistor comprising a gate terminal connected to the output terminal of the first inverter circuit and a current path, one end of the current path being supplied with the constant boosted potential and another end of the current path being connected to the output terminal of the first decoder circuit;

a second circuit having a second inverter circuit, a second P-channel transistor and an output terminal, the second inverter circuit comprising an input terminal connected to the output terminal of the second decoder circuit and an output terminal, the second inverter circuit being supplied with the constant boosted potential and the ground potential, the second P-channel transistor comprising a gate terminal connected to the output terminal of the second inverter circuit and a current path, one end of the current path being supplied with the constant boosted potential and another end of the current path being connected to the output terminal of the second decoder circuit;

a first word line driving circuit associated with the output terminal of the first circuit and driving the first word line; and a second word line driving circuit associated with the output terminal of the second circuit and driving the second word line.

17. The semiconductor memory device according to claim 16, wherein the output terminal of the first circuit is connected to the output terminal of the first decoder circuit, and the output terminal of the second circuit is connected to the output terminal of the second decoder circuit.

18. The semiconductor memory device according to claim 16, wherein the output terminal of the first circuit is connected to the output terminal of the first inverter circuit, and the output terminal of the second circuit is connected to the output terminal of the second inverter circuit.

19. The semiconductor memory device according to claim 16, wherein said first decoder circuit comprises:

a first precharging circuit having a current path supplied with the constant boosted potential, and transferring the constant boosted potential to the output terminal of the first decoder circuit in accordance with the boosted precharge signal;

a first decoding circuit having a current path supplied with the ground potential to the output terminal of the first decoder circuit in accordance with the first address signals;

a second precharging circuit having a current path supplied with the constant boosted potential, and transferring the constant boosted potential to the output terminal of the second decoder circuit in accordance with the boosted precharge signal; and a second decoding circuit having a current path supplied with the ground potential to the output terminal of the second decoder circuit in accordance with the second address signals.

20. The semiconductor memory device according to claim 19, wherein the first precharging circuit comprises a P-channel transistor which transfers the constant boosted potential to the output terminal of the first decoder circuit in accordance with the boosted precharge signal;

the first decoding circuit comprises series-connected N-channel transistors which transfer the ground potential to the output terminal of the first decoder circuit in accordance with the first address signals;

the second precharging circuit comprises a P-channel transistor which transfers the constant boosted potential to the output terminal of the second decoder circuit in accordance with the boosted precharge signal; and the second decoding circuit comprises series-connected N-channel transistors which transfer the ground potential to the output terminal of the second decoder circuit in accordance with the second address signals.

* * * * *